United States Patent
Tanaka

(10) Patent No.: US 12,525,463 B2
(45) Date of Patent: Jan. 13, 2026

(54) SUBSTRATE TREATMENT METHOD AND SUBSTRATE TREATMENT DEVICE

(71) Applicant: SCREEN Holdings Co., Ltd., Kyoto (JP)

(72) Inventor: Takayoshi Tanaka, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 222 days.

(21) Appl. No.: 18/550,634

(22) PCT Filed: Jan. 17, 2022

(86) PCT No.: PCT/JP2022/001446
§ 371 (c)(1),
(2) Date: Sep. 14, 2023

(87) PCT Pub. No.: WO2022/196072
PCT Pub. Date: Sep. 22, 2022

(65) Prior Publication Data
US 2024/0153780 A1    May 9, 2024

(30) Foreign Application Priority Data

Mar. 18, 2021  (JP) ................. 2021-045187

(51) Int. Cl.
*H01L 21/3213* (2006.01)
*H01L 21/02* (2006.01)
*H01L 21/67* (2006.01)

(52) U.S. Cl.
CPC .. *H01L 21/32134* (2013.01); *H01L 21/02238* (2013.01); *H01L 21/6708* (2013.01)

(58) Field of Classification Search
None
See application file for complete search history.

(56) References Cited

U.S. PATENT DOCUMENTS

| 6,021,786 A | 2/2000 | Jun et al. | |
| 6,357,457 B1 * | 3/2002 | Taniyama | B08B 3/02 |
| | | | 134/198 |
| 9,741,614 B1 * | 8/2017 | Kuo | H01L 21/31144 |
| 11,094,524 B2 * | 8/2021 | Otsuji | H01L 21/67253 |
| 2001/0037822 A1 * | 11/2001 | Elsawy | H01L 21/67028 |
| | | | 134/28 |

(Continued)

FOREIGN PATENT DOCUMENTS

| JP | H09-270414 A | 10/1997 |
| JP | 2003-297802 A | 10/2003 |

(Continued)

OTHER PUBLICATIONS

International Search Report mailed Mar. 1, 2022 in corresponding PCT International Application No. PCT/JP2022/001446.

(Continued)

*Primary Examiner* — Allan W. Olsen
(74) *Attorney, Agent, or Firm* — OSTROLENK FABER LLP

(57) ABSTRACT

A substrate processing method processes a substrate. The substrate has a major surface including a concave-portion forming surface that forms a concave portion. A to-be-removed layer is formed in the concave portion. The substrate processing method includes an etching step of supplying an etching liquid that contains etching ions to the major surface of the substrate to etch the to-be-removed layer, a concentrating step of concentrating the etching liquid on the major surface of the substrate, a hydrophilizing step of hydrophilizing the concave-portion forming surface exposed by concentrating the etching liquid, an ion diffusing step of diffusing the etching ions into a rinsing liquid by supplying the rinsing liquid to the major surface of the substrate after the hydrophilizing step, and a rinsing liquid removing step of removing the rinsing liquid from the major surface of the substrate.

13 Claims, 15 Drawing Sheets

(56) References Cited

U.S. PATENT DOCUMENTS

| | | | |
|---|---|---|---|
| 2006/0217286 A1* | 9/2006 | Geoffroy | C11D 3/3796 |
| | | | 510/490 |
| 2009/0029543 A1* | 1/2009 | Rothwell | H01L 21/02063 |
| | | | 257/E21.583 |
| 2009/0191716 A1 | 7/2009 | Nakamori | |
| 2014/0234873 A1* | 8/2014 | Leck | C12M 25/01 |
| | | | 435/7.1 |
| 2015/0273535 A1 | 10/2015 | Sato et al. | |
| 2020/0273696 A1 | 8/2020 | Hinode et al. | |
| 2021/0299712 A1* | 9/2021 | Akiyama | B08B 3/08 |
| 2021/0315104 A1* | 10/2021 | Klocek | H05K 3/067 |
| 2022/0148888 A1 | 5/2022 | Kobayashi et al. | |

FOREIGN PATENT DOCUMENTS

| | | |
|---|---|---|
| JP | 2009-182136 A | 8/2009 |
| JP | 2010-093082 A | 4/2010 |
| JP | 2010-135209 A | 6/2010 |
| JP | 2015-185713 A | 10/2015 |
| JP | 2019-057600 A | 4/2019 |
| JP | 2020-155612 A | 9/2020 |

OTHER PUBLICATIONS

International Preliminary Report on Patentability (Chapter I) mailed Sep. 28, 2023 with a Notification from the International Bureau (Form PCT/IB/326) in corresponding PCT International Application No. PCT/JP2022/001446 in Japanese.

English translation of the International Preliminary Report on Patentability (Chapter I) mailed Sep. 28, 2023 with a copy of Notification from the International Bureau (Form PCT/IB/338) in corresponding PCT International Application No. PCT/JP2022/001446 with a Notification from the International Bureau (Form PCT/IB/338).

* cited by examiner

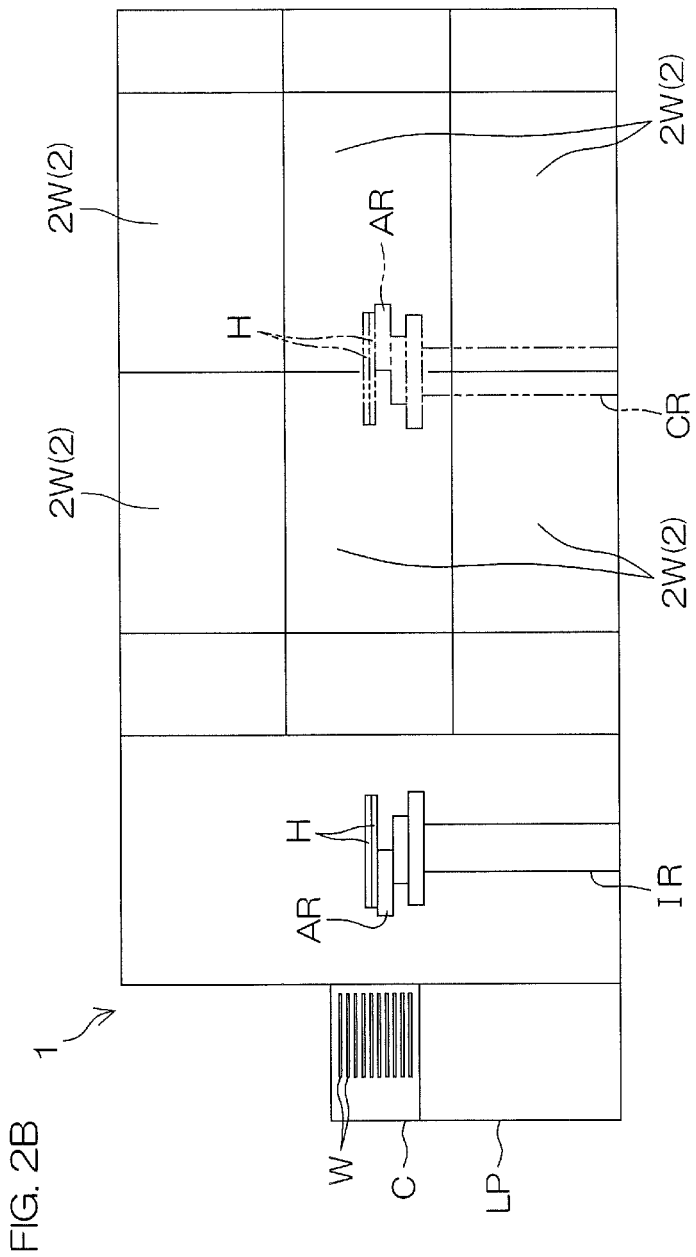

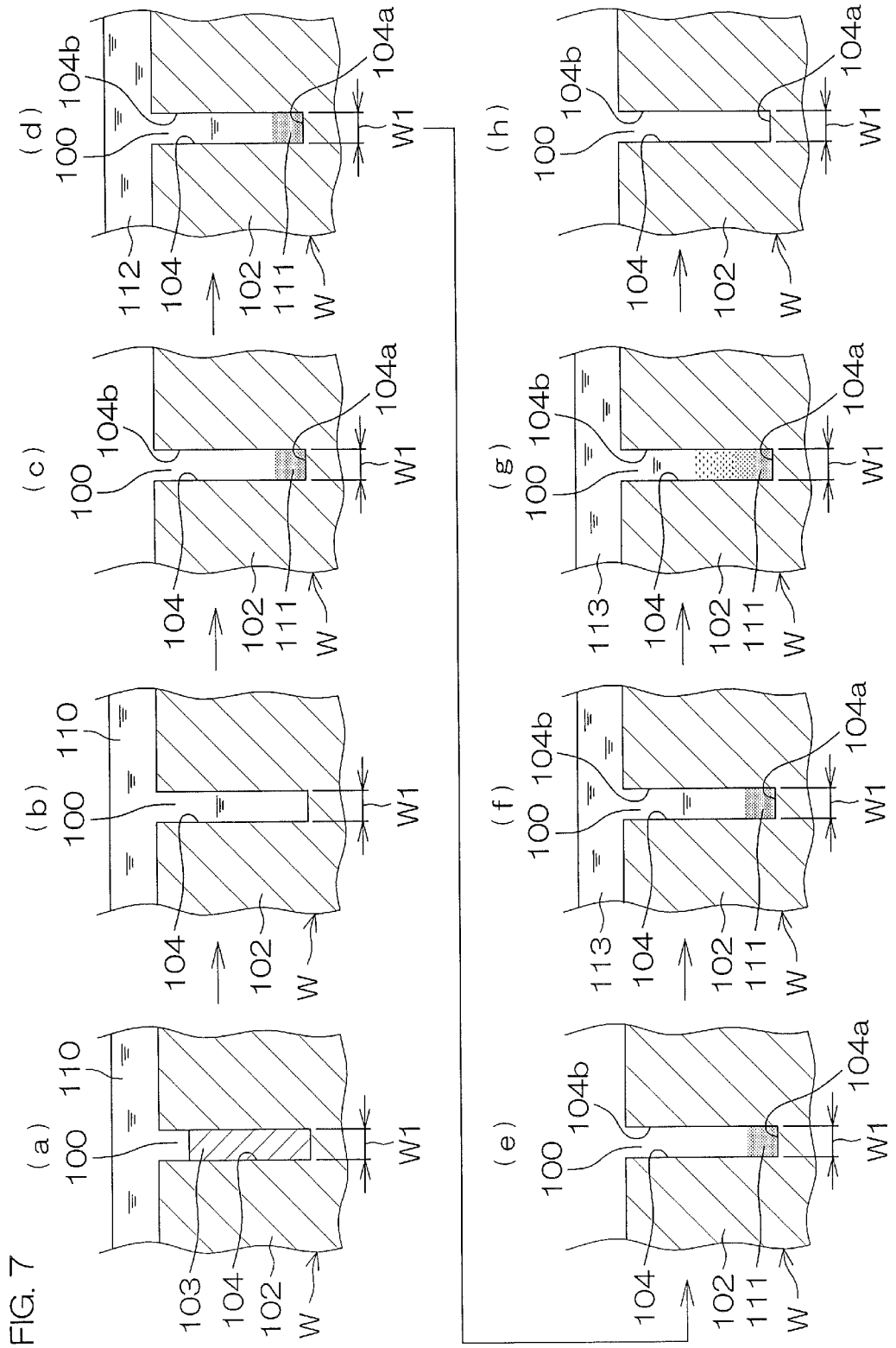

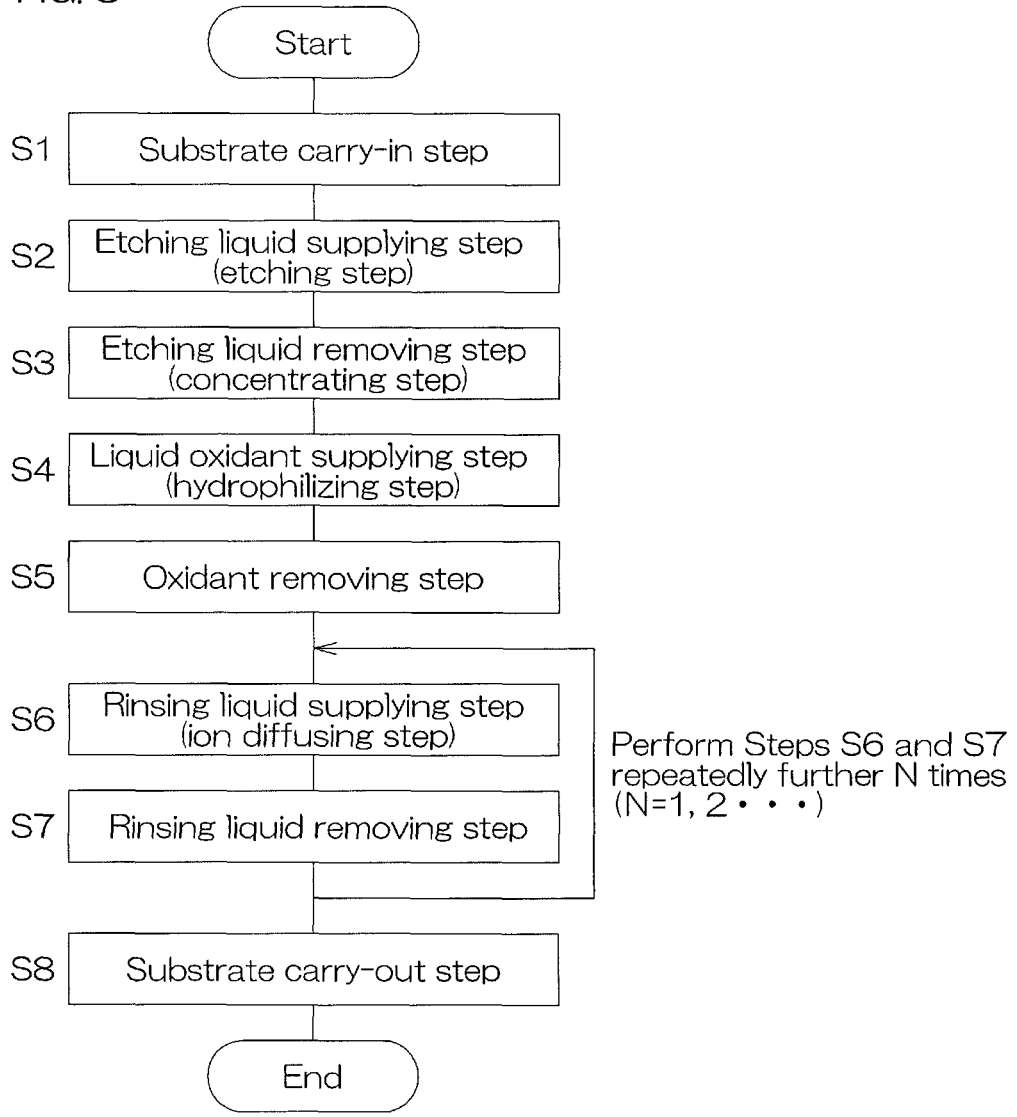

SUBSTRATE TREATMENT METHOD AND SUBSTRATE TREATMENT DEVICE

CROSS-REFERENCE TO RELATED APPLICATIONS

The present application is a 35 U.S.C. §§ 371 national stage application of International Application No. PCT/JP2022/001446 filed Jan. 17, 2022, which claims priority to Japanese Patent Application No. 2021-045187, filed Mar. 18, 2021, the contents of which are incorporated herein by reference.

TECHNICAL FIELD

The present invention relates to a substrate processing method for processing a substrate and a substrate processing apparatus that processes a substrate.

Examples of substrates to be processed include semiconductor wafers, substrates for FPDs (Flat Panel Displays) such as liquid crystal displays or organic EL (Electroluminescence) displays, substrates for optical disks, substrates for magnetic disks, substrates for magneto-optical disks, substrates for photomasks, ceramic substrates, substrates for solar batteries, etc.

BACKGROUND ART

Patterns are formed by etching in a variety of shapes. With pattern miniaturizing or with three-dimensional structuring of electronic components, a concave or recess portion having a narrow opening is required to be formed by etching.

Therefore, Patent Literature 1 shown below discloses a technique for hydrophilizing a front surface of a concave portion having a narrow opening in order to facilitate the entry of an etching liquid into the concave portion.

CITATION LIST

Patent Literature

Patent Literature 1: Japanese Patent Application Publication No. 2020-155612

SUMMARY OF INVENTION

Technical Problem

An etching liquid is limited in movement in a narrow space. Therefore, there is a concern that an etching liquid that has entered the concave portion having the narrow opening cannot be sufficiently removed from the inside of the concave portion in Patent Literature 1.

Therefore, an object of the present invention is to provide a substrate processing method and a substrate processing apparatus both of which are capable of, in a configuration in which a to-be-removed layer in a concave portion formed at a major surface of a substrate is etched, preventing an etching liquid from remaining in the concave portion.

Solution to Problem

A preferred embodiment of the present invention provides a substrate processing method for processing a substrate. The substrate has a major surface including a concave-portion forming surface that forms a concave or recess portion. The substrate has a to-be-removed layer formed in the concave portion.

The substrate processing method includes an etching step of supplying an etching liquid that contains etching ions to the major surface of the substrate to etch the to-be-removed layer, a concentrating step of concentrating the etching liquid on the major surface of the substrate, a hydrophilizing step of hydrophilizing the concave-portion forming surface exposed by concentrating the etching liquid, an ion diffusing step of diffusing the etching ions into a rinsing liquid by supplying the rinsing liquid to the major surface of the substrate after the hydrophilizing step, and a rinsing liquid removing step of removing the rinsing liquid from the major surface of the substrate.

According to this substrate processing method, the to-be-removed layer, such as a metal layer, is removed by the etching liquid, and then the etching liquid is concentrated. Therefore, the etching liquid remains in the concave portion, whereas the concave-portion forming surface is exposed. Therefore, it is possible to excellently hydrophilize the concave-portion forming surface through the subsequent hydrophilizing step.

The concave-portion forming surface is hydrophilized, and thereafter the rinsing liquid is supplied to the major surface of the substrate, and therefore the rinsing liquid easily enters the inside of the concave portion. The rinsing liquid that has entered the inside of the concave portion comes into contact with the etching liquid that has been concentrated, and therefore a difference in ionic concentration (ion concentration gradient) therebetween occurs. In detail, the etching liquid in which the concentration of the etching ions is high because of concentration and the rinsing liquid that does not contain the etching ions come into contact with each other. Therefore, the etching ions diffuse into the rinsing liquid in order to equalize the concentration of the etching ions. This makes it possible to prevent the etching ions from moving outwardly from the concave portion and to prevent the etching liquid from remaining in the concave portion. Thereafter, the rinsing liquid is removed from on the major surface of the substrate, thereby making it possible to remove the etching ions from on the major surface of the substrate. Therefore, it is possible to prevent the rinsing liquid from being concentrated and to prevent the etching ions from remaining in the concave portion.

In a preferred embodiment of the present invention, a width of the concave portion is 5 nm or less. If so, the movement of the rinsing liquid into the concave portion is easily restricted. Therefore, it is possible to facilitate the entry of the rinsing liquid into the concave portion if the concave-portion forming surface is hydrophilized after the etching liquid is concentrated.

In a preferred embodiment of the present invention, after the rinsing liquid removing step, the ion diffusing step and the rinsing liquid removing step are each performed repeatedly at least once. According to this method, it is possible to sufficiently remove the etching ions remaining in the concave portion by performing diffusion by means of the rinsing liquid a plurality of times even if the etching ions remaining in the concave portion cannot be sufficiently removed by performing diffusion by means of the rinsing liquid once.

In a preferred embodiment of the present invention, the hydrophilizing step includes an oxidation step of oxidizing the concave-portion forming surface.

In a preferred embodiment of the present invention, the oxidation step includes a liquid oxidant supplying step of supplying a liquid oxidant to the major surface of the substrate. According to this method, the hydrophilization of the concave-portion forming surface performed during the supply of the etching liquid and during the supply of the rinsing liquid is achieved by supplying a liquid oxidant, i.e., by supplying a liquid. Therefore, there is no need to move the substrate into another chamber for hydrophilization unlike a case in which the concave-portion forming surface is hydrophilized by supplying a gaseous oxidant or by irradiating ultraviolet rays. Therefore, it is possible to swiftly perform substrate processing.

In a preferred embodiment of the present invention, the substrate processing method further includes an oxidant removing step of removing a liquid oxidant supplied to the major surface of the substrate from the major surface of the substrate before the ion diffusing step.

According to this method, the liquid oxidant is removed from the major surface of the substrate before supplying the rinsing liquid to the major surface of the substrate. Therefore, it is possible to prevent the oxidant from being mixed with the rinsing liquid supplied to the major surface of the substrate and prevent the ionic concentration in the rinsing liquid from being raised. Therefore, it is possible to prevent a decrease in ionic concentration gradient generated by bringing the concentrated etching liquid and the rinsing liquid into contact with each other. As a result, it is possible to prevent the etching liquid from remaining in the concave portion.

In a preferred embodiment of the present invention, the oxidation step includes a dry oxidation step of performing at least either one of supply of a gaseous oxidant to the major surface of the substrate and irradiation of light to the major surface of the substrate. According to this method, it is possible to hydrophilize the concave-portion forming surface without using a liquid. Therefore, it is possible to prevent an increase in ionic concentration in the rinsing liquid caused by allowing a liquid used for the hydrophilization of the substrate to mix with the rinsing liquid.

In a preferred embodiment of the present invention, the concentrating step includes a drying step of drying the major surface of the substrate.

In a preferred embodiment of the present invention, the etching step includes an etching liquid supplying step of discharging the etching liquid from an etching liquid nozzle to the major surface of the substrate held by a substrate holding member and supplying the etching liquid to the major surface of the substrate. Additionally, the drying step includes a rotating/evaporating step of rotating the substrate by rotating the substrate holding member around a rotational axis that passes through a central portion of the major surface of the substrate and that perpendicularly intersects the major surface of the substrate to evaporate a solvent component contained in the etching liquid from the major surface of the substrate.

Both the supply of the etching liquid to the major surface of the substrate and the evaporation of the solvent component of the etching liquid from the major surface of the substrate are performed in a state in which the substrate is being held by the substrate holding member. Therefore, it is possible to concentrate the etching liquid swiftly after the etching operation is ended.

In a preferred embodiment of the present invention, the drying step includes a decompressing/evaporating step of evaporating a solvent component contained in the etching liquid from the major surface of the substrate by decompressing a space contiguous to the major surface of the substrate. According to this method, it is possible to swiftly concentrate the etching liquid by decompressing a space contiguous to the major surface of the substrate.

Another preferred embodiment of the present invention provides a substrate processing apparatus that processes a substrate. The substrate has a major surface including a concave-portion forming surface that forms a concave or recess portion. The substrate has a to-be-removed layer formed in the concave portion. The substrate processing apparatus includes an etching-liquid supply member that supplies an etching liquid containing etching ions and etching the to-be-removed layer to the major surface of the substrate, an etching-liquid concentrating member that concentrates the etching liquid on the major surface of the substrate, a hydrophilizing member that hydrophilizes the concave-portion forming surface exposed by concentrating the etching liquid, a rinsing-liquid supply member that supplies a rinsing liquid that diffuses the etching ions into a liquid to the major surface of the substrate, and a rinsing-liquid removing member that removes the rinsing liquid from the major surface of the substrate. With this substrate processing apparatus, the same effect as in the above-described substrate processing method is fulfilled.

The above and other objects, features, and advantages of the present invention will become more apparent from the following detailed description of the preferred embodiments with reference to the attached drawings.

BRIEF DESCRIPTION OF DRAWINGS

FIG. 2B is an elevational view for describing the configuration of the substrate processing apparatus.

FIG. 7 is a schematic view for describing an aspect near an upper surface of a substrate being subjected to the substrate processing.

FIG. 8 is a flowchart for describing another example of the substrate processing.

DESCRIPTION OF EMBODIMENTS

<Structure of Surface Layer Portion of Substrate to be Processed>

Figure 1A:
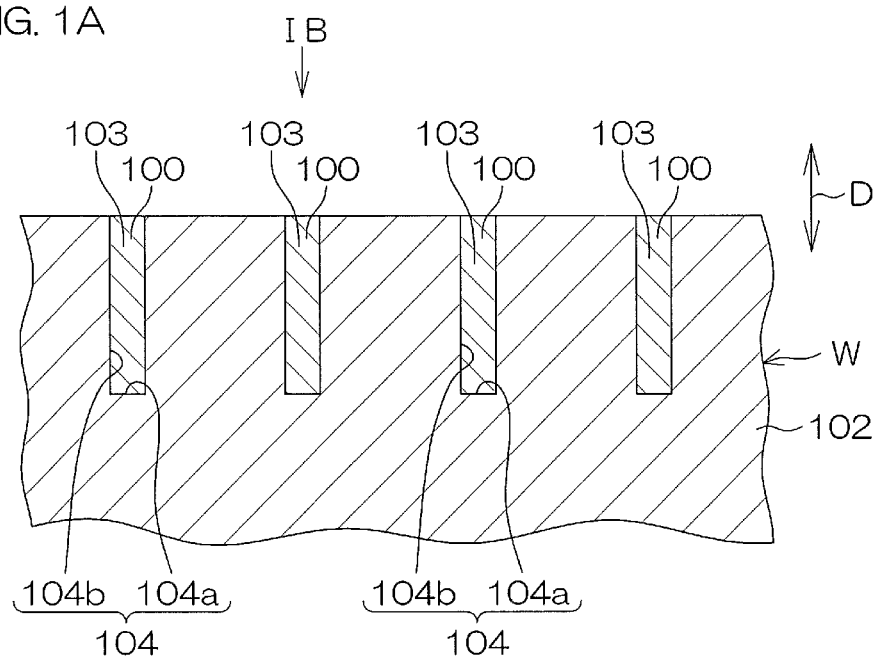
FIG. 1A is a schematic cross-sectional view for describing a structure of a surface layer portion of a device surface of a substrate to be processed.
Figure 1B:
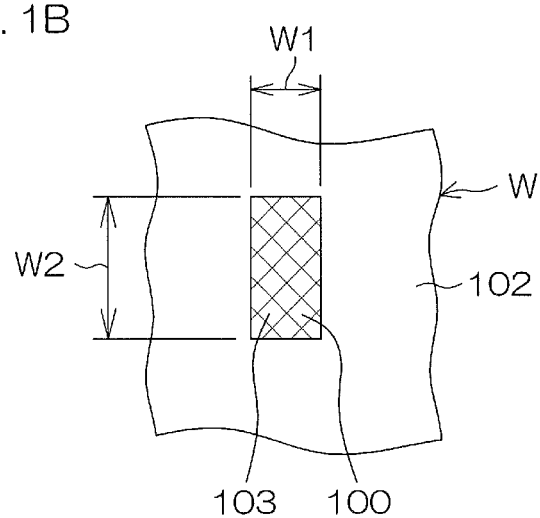
FIG. 1B is a view seen from arrow IB of FIG. 1A.

FIG. 1A is a schematic cross-sectional view for describing a structure of a surface layer portion of a device surface of a substrate W to be processed. FIG. 1B is a view seen from arrow IB of FIG. 1A. The substrate W is a substrate such as a silicon wafer, and has a pair of major surfaces. At least one of the pair of major surfaces is a device surface on which a concavo-convex pattern is formed. One of the pair of major surfaces may be a non-device surface on which a concavo-convex pattern is not formed, and there can be a case in which mutually different concavo-convex patterns are formed even if both of the pair of major surfaces are device surfaces, respectively.

For example, a structural component 102 in which a plurality of concave or recess portions 100 are formed and a plurality of metal layers 103 respectively embedded in the concave portions 100 are formed at a surface layer portion of at least one device surface. The structural component 102 may be, for example, a silicon oxide ($SiO_2$) layer, or an insulation layer such as a silicon nitride (SiN) insulation layer, or a semiconductor layer such as a polysilicon semiconductor layer, or a combination of these layers. The metal layer 103 is, for example, titanium nitride. The metal layer 103 is an example of a to-be-removed layer, and yet the to-be-removed layer is not limited to the metal layer.

The structural component 102 has a plurality of concave-portion forming surfaces 104 that form a plurality of concave portions 100, respectively. The concave-portion forming surface 104 configures a part of the major surface of the substrate W. The concave-portion forming surface 104 has a bottom surface 104a that forms a bottom portion of the concave portion 100 and a side surface 104b that forms an opening of the concave portion 100.

The concave portion 100 is formed in, for example, a quadrangular shape when seen in a depth direction D of the concave portion 100, and the width W1 of a short side of the concave portion 100 is not less than 1 nm and not more than 5 nm, and the width W2 of a long side of the concave portion 100 is not less than 10 nm and not more than 50 nm. Unlike FIG. 1B, the concave portion 100 may be formed in a circular shape when seen in the depth direction D. In this case, the diameter (width) of the concave portion 100 may be not less than 1 nm and not more than 5 nm.

<Configuration of Substrate Processing Apparatus According to First Preferred Embodiment>

Figure 2A:
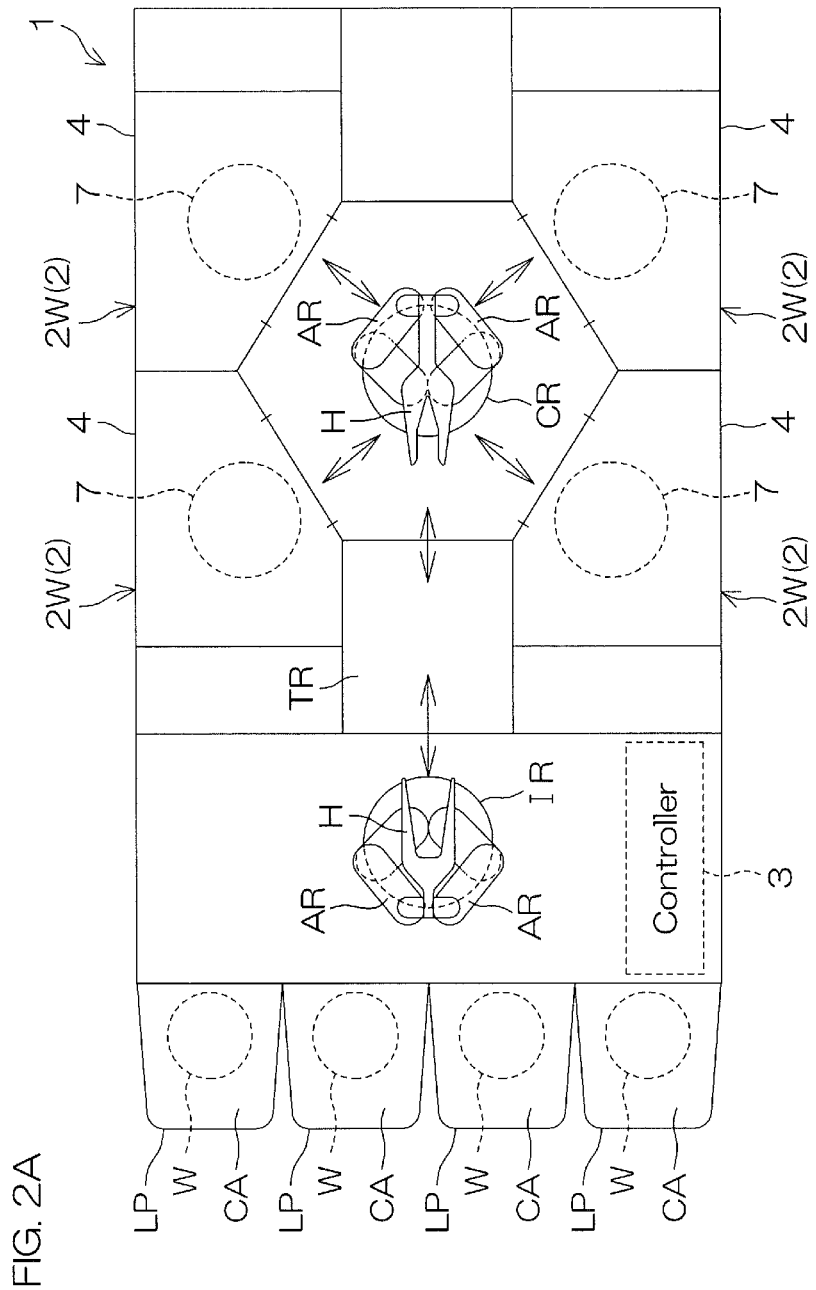
FIG. 2A is a plan view for describing a configuration of a substrate processing apparatus according to a first preferred embodiment of the present invention.

FIG. 2A is a plan view for describing a configuration of the substrate processing apparatus 1 according to a first preferred embodiment of the present invention. FIG. 2B is an elevational view to describe a configuration of the substrate processing apparatus 1.

The substrate processing apparatus 1 is a single substrate processing type apparatus that processes substrates W one by one. The substrate W is a disk-shaped substrate in the preferred embodiment. The substrate W is processed in an attitude in which a device surface on which the structural component 102 is formed at the surface layer portion is directed upwardly in the preferred embodiment.

The substrate processing apparatus 1 includes a plurality of processing unit 2 that processes a substrate W, a load port LP in which a carrier CA that houses a plurality of substrates W to be processed by the processing unit 2 is placed, transfer robots IR and CR both of which transfer a substrate W between the load port LP and the processing unit 2, and a controller 3 that controls the substrate processing apparatus 1.

The transfer robot IR transfers a substrate W between a carrier CA and the transfer robot CR. The transfer robot CR transfers a substrate W between the transfer robot IR and the processing unit 2.

Each of the transfer robots IR and CR is, for example, an articulated-arm robot including a pair of articulated arms AR and a pair of hands H respectively provided at front ends of the pair of articulated arms AR so as to recede from each other upwardly and downwardly.

The processing units 2 respectively form four processing towers disposed at four positions distant horizontally. Each of the processing towers includes the processing units 2 stacked together in the up-down direction (in the preferred embodiment, three processing units) (see FIG. 2B). The four processing towers are disposed two by two on both sides of a transfer path TR that extends from the load port LP toward the transfer robots IR, CR (see FIG. 2A).

In the first preferred embodiment, the processing unit 2 is a wet processing unit 2W that processes a substrate W with a liquid. Each of the wet processing units 2W includes a chamber 4 and a processing cup 7 disposed in the chamber 4, and performs a processing operation for a substrate W in the processing cup 7.

The chamber 4 has an entrance/exit (not shown) through which a substrate W is carried in or is carried out by the transfer robot CR. The chamber 4 is provided with a shutter unit (not shown) that opens and closes the entrance/exit.

Figure 3:
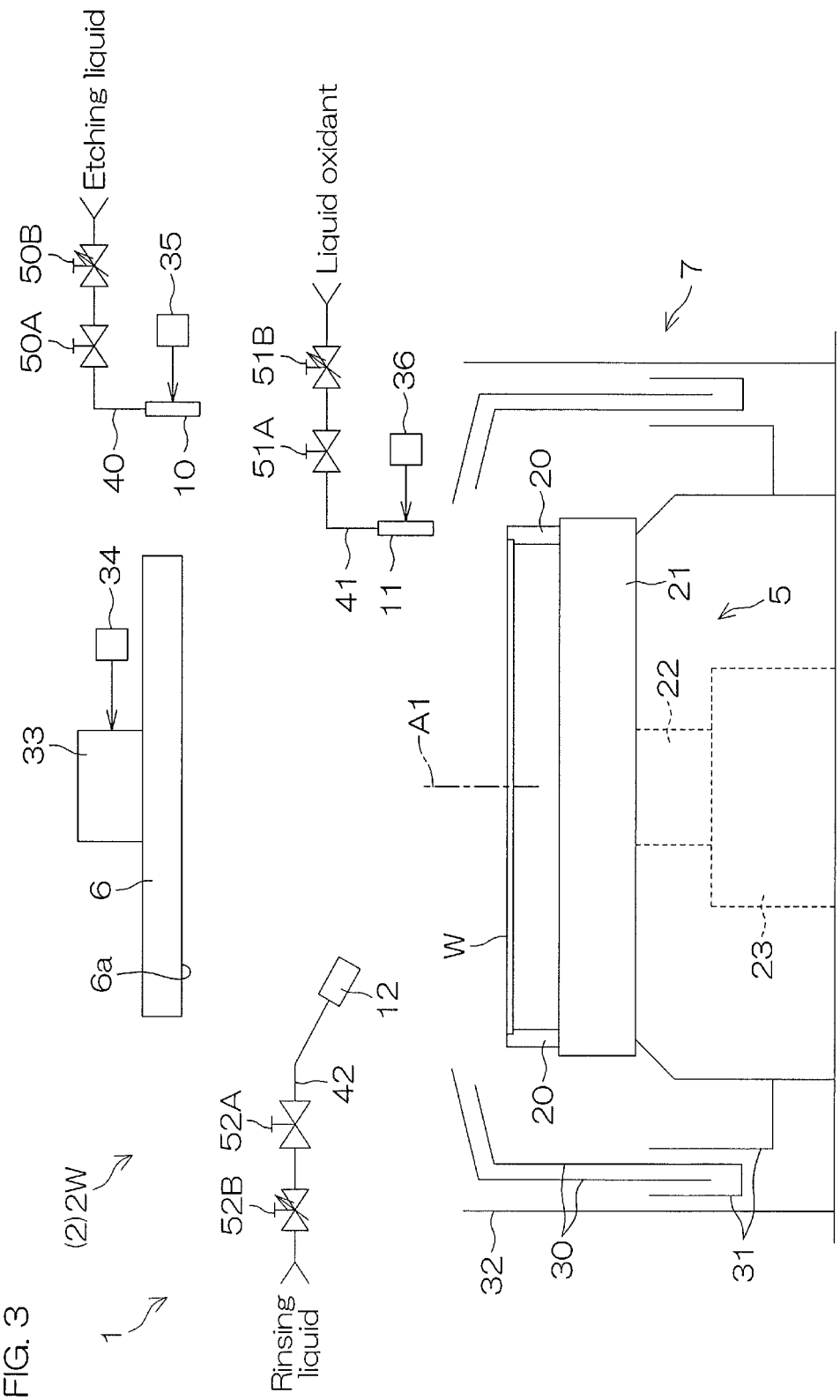
FIG. 3 is a cross-sectional view for describing a configuration example of a wet processing unit included in the substrate processing apparatus.

FIG. 3 is a schematic cross-sectional view for describing a configuration example of the wet processing unit 2W.

The wet processing unit 2W additionally includes a spin chuck 5 that rotates a substrate W around a rotational axis A1 (vertical axis) while holding the substrate W at a predetermined first holding position and a facing member 6 that faces the substrate W held by the spin chuck 5 from above. The rotational axis A1 passes through a central portion of the substrate W, and perpendicularly intersects the major surface of the substrate W. In other words, the rotational axis A1 vertically extends. The first holding position is a position of the substrate W shown in FIG. 3, and is a position at which the substrate W is held in a horizontal attitude.

The spin chuck 5 includes a spin base 21 that has a disk shape along a horizontal direction, a plurality of chuck pins 20 that grip a substrate W above the spin base 21 and that hold the substrate W at the first holding position, a rotational shaft 22 an upper end of which is connected to the spin base 21 and that extends in the vertical direction, and a rotation driving member 23 that rotates the rotational shaft 22 around its central axis (rotational axis A1). The spin chuck 5 is an example of a substrate holding member.

The chuck pins 20 are disposed at a distance from each other in a circumferential direction of the spin base 21 on an upper surface of the spin base 21. The rotation driving member 23 includes, for example, an actuator such as an electric motor. The rotation driving member 23 rotates the rotational shaft 22, and, as a result, allows the spin base 21 and the chuck pins 20 to rotate around the rotational axis A1. Thereby, the substrate W is rotated around the rotational axis A1 together with the spin base 21 and the chuck pins 20.

The chuck pins 20 are movable between a closed position at which the chuck pins 20 grip the substrate W while being in contact with a peripheral edge portion of the substrate W and an open position to which the chuck pins 20 recede from the peripheral edge portion of the substrate W. The chuck pins 20 are moved by an opening-closing mechanism (not shown). The chuck pins 20 grip the peripheral edge portion of the substrate W and horizontally hold the substrate W when placed at the closed position. For example, the opening-closing mechanism includes a link mechanism and an actuator that gives a driving force to the link mechanism.

The facing member 6 is a plate-shaped member that shuts off an atmosphere of a space between the upper surface of the substrate W held by the spin chuck 5 and the facing member 6 from an atmosphere outside this space. Therefore, the facing member 6 is referred to also as a shut-off plate.

The facing member 6 has a facing surface 6a that faces the upper surface of the substrate W held by the spin chuck 5 from above. The facing member 6 is formed in a disk shape having a diameter substantially equal to or more than the substrate W. The support shaft 33 is fixed on the side opposite to the facing surface 6a in the facing member 6.

The facing member 6 is connected to a facing-member elevation mechanism 34 that raises and lowers the facing member 6. The facing-member elevation mechanism 34 may include, for example, an electric motor or an air cylinder that drives the support shaft 33 in an up-and-down direction, or may include an actuator other than these devices. The facing member 6 may be rotatable around the rotational axis A1.

The processing cup 7 receives a liquid spattering from the substrate W held by the spin chuck 5. The processing cup 7 includes a plurality of (in the example of FIG. 3, two) guards 30 that catch a liquid that spatters outwardly from the substrate W held by the spin chuck 5, a plurality of (in the example of FIG. 3, two) cups 31 that catch a liquid that is downwardly guided by the guards 30, and a circular-cylindrical outer-wall member 32 that surrounds the guards 30 and the cups 31. The guards 30 are individually raised and lowered by a guard elevation driving mechanism (not shown). The guard elevation driving mechanism may include, for example, an electric motor or an air cylinder that drives each of the guards 30 in the up-and-down direction, or may include an actuator other than these devices.

The wet processing unit 2W additionally includes an etching-liquid nozzle 10 that supplies an etching liquid to the upper surface (upper major surface) of the substrate W held by the spin chuck 5, a liquid oxidant nozzle 11 that supplies a liquid oxidant to the upper surface of the substrate W held by the spin chuck 5, and a rinsing-liquid nozzle 12 that supplies a rinsing liquid to the upper surface of the substrate W held by the spin chuck 5.

For example, the etching liquid is a hydrofluoric acid or an APM liquid (ammonia hydrogen peroxide water mixed liquid), and is a liquid that contains etching ions and that etches the metal layer 103. The etching ion is, for example, $HF_2^-$ or $NH_4^+$, and is a component used to oxidize and remove the metal layer 103. The etching ion is $HF_2^-$ if the etching liquid is a hydrofluoric acid, and the etching ion is $NH_4^+$ if the etching liquid is an APM liquid. For example, a solvent component contained in the etching liquid is water.

The etching liquid may contain a movement accelerator, such as ammonium chloride that accelerates the movement of etching ions in the concave portion 100.

The liquid oxidant is an example of a hydrophilizing liquid that hydrophilizes the major surface of the substrate W. For example, the liquid oxidant is a liquid oxidant that hydrophilizes the major surface of the substrate W by oxidizing the major surface of the substrate W. For example, the liquid oxidant is an APM liquid, hydrogen peroxide water, ozonized water, or a liquid obtained by mixing these liquids together. Hydrogen peroxide, ozone, etc., are contained in the liquid oxidant as an oxidant.

Preferably, the rinsing liquid is composed mainly of the same components as the solvent components of the etching liquid (for example, water). For example, the rinsing liquid is a component containing at least one among deionized water (DIW), carbonic water, electrolyzed ion water, hydrochloric acid water having a diluted concentration (for example, not less than 1 ppm and not more than 100 ppm), ammonia water having a diluted concentration (for example, not less than 1 ppm and not more than 100 ppm), and reduced water (hydrogenated water). Particularly preferably, electrolyte is not contained in the rinsing liquid, and, particularly preferably, DIW is used as the rinsing liquid.

Both the etching-liquid nozzle 10 and the liquid oxidant nozzle 11 are movable nozzles, respectively, that are movable at least in the horizontal direction. The etching-liquid nozzle 10 and the liquid oxidant nozzle 11 are moved in the horizontal direction by means of a plurality of nozzle moving mechanisms (first nozzle moving mechanism 35 and second nozzle moving mechanism 36), respectively. Each of the nozzle moving mechanisms includes an arm (not shown) that supports a corresponding nozzle and an arm moving mechanism (not shown) that moves a corresponding arm in the horizontal direction. Each of the arm moving mechanisms may include an electric motor or an air cylinder, or may include an actuator other than these devices. Unlike the preferred embodiment, the etching-liquid nozzle 10 and the liquid oxidant nozzle 11 may be configured to be moved together by means of a shared nozzle moving mechanism.

The etching-liquid nozzle 10 and the liquid oxidant nozzle 11 may be configured to be movable also in the vertical direction.

In the preferred embodiment, the rinsing-liquid nozzle 12 is a stationary nozzle whose horizontal and vertical positions are fixed, and yet may be a movable nozzle in the same way as both the etching-liquid nozzle 10 and the liquid oxidant nozzle 11.

The etching-liquid nozzle 10 is connected to an end of an etching liquid pipe 40 that guides an etching liquid to the etching-liquid nozzle 10. The other end of the etching liquid pipe 40 is connected to an etching liquid tank (not shown). An etching liquid valve 50A that opens and closes a flow path in the etching liquid pipe 40 and an etching liquid flow-rate adjusting valve 50B that adjusts the flow rate of an etching liquid in this flow path are interposed in the etching liquid pipe 40.

When the etching liquid valve 50A is opened, an etching liquid is discharged downwardly from a discharge port of the etching-liquid nozzle 10 in the manner of a continuous flow at the flow rate according to the opening degree of the etching liquid flow-rate adjusting valve 50B. The etching-liquid nozzle 10 is an example of an etching liquid supply member.

The liquid oxidant nozzle 11 is connected to an end of a liquid oxidant pipe 41 that guides a liquid oxidant to the liquid oxidant nozzle 11. The other end of the liquid oxidant pipe 41 is connected to a liquid oxidant tank (not shown). A liquid oxidant valve 51A that opens and closes a flow path in the liquid oxidant pipe 41 and a liquid oxidant flow-rate adjusting valve 51B that adjusts the flow rate of a liquid oxidant in this flow path are interposed in the liquid oxidant pipe 41.

When the liquid oxidant valve 51A is opened, a liquid oxidant is discharged downwardly from a discharge port of the liquid oxidant nozzle 11 in the manner of a continuous flow at the flow rate according to the opening degree of the liquid oxidant flow-rate adjusting valve 51B. The liquid oxidant nozzle 11 is an example of a liquid oxidant supply member.

The rinsing-liquid nozzle 12 is connected to an end of a rinsing-liquid pipe 42 that guides a rinsing liquid to the rinsing-liquid nozzle 12. The other end of the rinsing-liquid pipe 42 is connected to a rinsing liquid tank (not shown). A rinsing-liquid valve 52A that opens and closes a flow path in the rinsing-liquid pipe 42 and a rinsing liquid flow-rate adjusting valve 52B that adjusts the flow rate of a rinsing liquid in this flow path are interposed in the rinsing-liquid pipe 42.

When the rinsing-liquid valve 52A is opened, a rinsing liquid is discharged from a discharge port of the rinsing-liquid nozzle 12 in the manner of a continuous flow at the flow rate according to the opening degree of the rinsing liquid flow-rate adjusting valve 52B. The rinsing-liquid nozzle 12 is an example of a rinsing liquid supply member.

Figure 4:
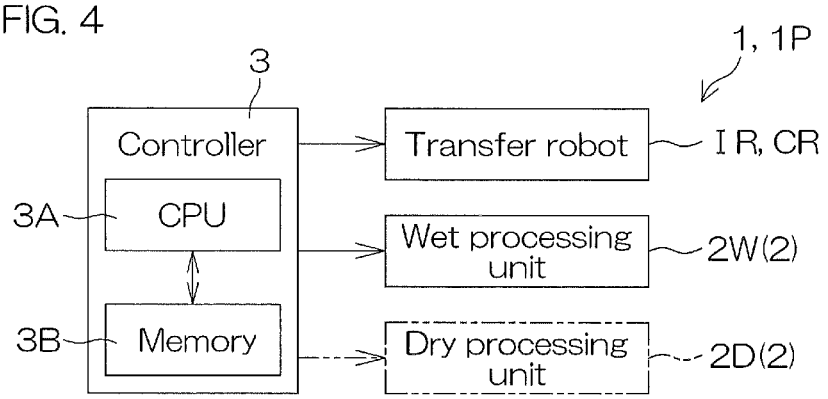
FIG. 4 is a block diagram for describing a configuration example concerning the control of the substrate processing apparatus.

FIG. 4 is a block diagram for describing a configuration example concerning the control of the substrate processing apparatus 1.

The controller 3 includes a microcomputer, and controls a to-be-controlled component provided in the substrate processing apparatus 1 in accordance with a predetermined program. More concretely, the controller 3 includes a processor (CPU) 3A and a memory 3B in which a program is stored, and is configured to perform a variety of control processes for substrate processing by allowing the processor 3A to execute the program.

Particularly, the controller 3 is programmed to control each member (valve, motor, etc.), of which the wet processing unit 2W is composed, the transfer robots IR and CR, etc. Likewise, the controller 3 controls each member (valve, motor, power source, etc.), of which a dry processing unit 2D described later is composed.

Valves are controlled by the controller 3, and, as a result, the presence or absence of the discharge of a fluid from a corresponding nozzle or the flow amount of a fluid discharged from a corresponding nozzle is controlled. The following steps are performed by allowing the controller 3 to control these constituents. In other words, the controller 3 is programmed to perform the following steps.

<Example of Substrate Processing>

Figure 5:
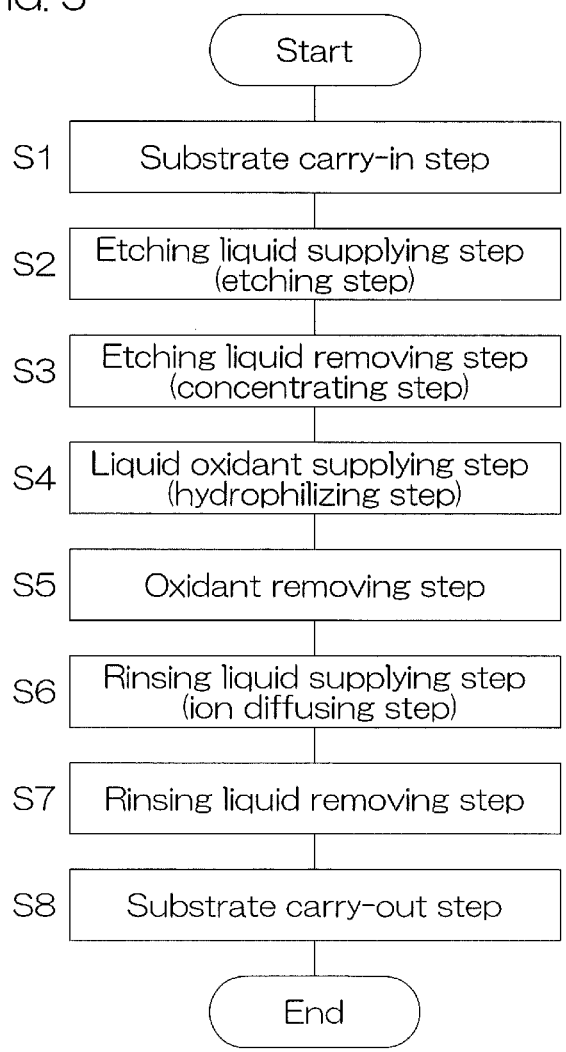
FIG. 5 is a flowchart for describing an example of substrate processing performed by the substrate processing apparatus.

FIG. 5 is a flowchart for describing an example of substrate processing performed by the substrate processing apparatus 1. FIG. 5 mainly shows a processing operation realized by allowing the controller 3 to execute the program. FIG. 6A to FIG. 6D are schematic views each of which is for describing an aspect of each step of substrate processing performed by the substrate processing apparatus 1.

In substrate processing performed by the substrate processing apparatus 1, a substrate carry-in step (Step S1), an etching liquid supplying step (Step S2), an etching liquid removing step (Step S3), a liquid oxidant supplying step (Step S4), an oxidant removing step (Step S5), a rinsing liquid supplying step (Step S6), a rinsing liquid removing step (Step S7), and a substrate carry-out step (Step S8) are performed in this order as shown in, for example, FIG. 5.

Substrate processing performed by the substrate processing apparatus 1 will be hereinafter described with reference mainly to FIG. 3 and FIG. 5. Reference will be appropriately made to FIGS. 6A to 6D.

First, a not-yet-processed substrate W is carried from the carrier CA to the wet processing unit 2W by means of the transfer robots IR and CR (see FIG. 2A), and is delivered to the spin chuck 5 (substrate carry-in step: Step S1). Thereby, the substrate W is horizontally held by the spin chuck 5 (substrate holding step). The holding of the substrate W by means of the spin chuck 5 is continuously performed until the rinsing liquid removing step (Step S7) is ended. When the substrate W is carried into the wet processing unit 2W, the facing member 6 is disposed at a distant position (position of the facing member 6 shown in FIG. 3) at which the nozzle can be passed between the substrate W and the facing member 6. The rotation driving member 23 starts the rotation of the substrate W in a state in which the substrate W is being held by the spin chuck 5.

Thereafter, the transfer robot CR recedes outwardly from the processing unit 2, and then the etching liquid supplying step (Step S2) that supplies an etching liquid to an upper surface of the substrate W is performed.

Figure 6A:
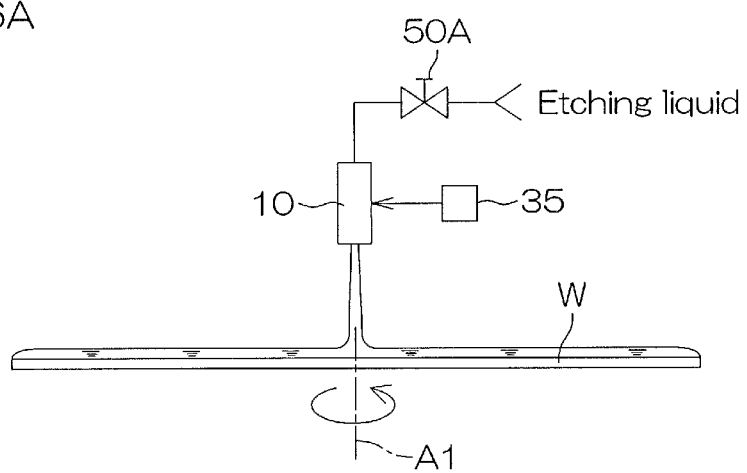
FIG. 6A is a schematic view for describing an aspect of a substrate when the substrate processing is performed.

In detail, the first nozzle moving mechanism 35 moves the etching-liquid nozzle 10 to a processing position, and the etching liquid valve 50A is opened in a state in which the etching-liquid nozzle 10 is placed at the processing position. Thereby, an etching liquid is discharged from the etching-liquid nozzle 10 toward the upper surface of the substrate W as shown in FIG. 6A (etching liquid discharge step). The etching liquid discharged from the etching-liquid nozzle 10 is landed on the upper surface of the substrate W. The etching liquid is spread entirely on the upper surface of the substrate W by means of the operation of a centrifugal force, and is supplied to the entirety of the upper surface of the substrate W (etching liquid supplying step).

In this substrate processing, the processing position of the etching-liquid nozzle 10 is a center position at which the discharge port of the etching-liquid nozzle 10 faces a central region of the upper surface of the substrate W. Therefore, the etching liquid is landed on the central region of the upper surface of the substrate W. Unlike this substrate processing, the etching-liquid nozzle 10 may discharge an etching liquid while horizontally moving along the upper surface of the substrate W.

The discharge of the etching liquid is continuously performed at a predetermined discharge flow amount during a predetermined etching liquid discharge period. The etching liquid discharge period is, for example, not less than 5 seconds and not more than 180 seconds. The discharge flow amount of the etching liquid is, for example, not less than 500 mL/min and not more than 2000 mL/min. The substrate W is rotated, for example, at a rotation speed of not less than 300 rpm and not more than 1200 rpm during the discharge of the etching liquid.

After the etching liquid supplying step is completed, the etching liquid removing step (Step S3) in which the etching liquid is removed from the upper surface of the substrate W is performed.

In detail, the etching liquid valve 50A is closed, and the discharge of the etching liquid is stopped, and the substrate W is rotated at a high speed while the rotation driving member 23 is accelerating the rotation of the substrate W. In the etching liquid removing step, the substrate W is rotated at a rotation speed of, for example, not less than 1500 rpm and not more than 2500 rpm during a period of, for example, not less than 60 seconds and not more than 180 seconds. The substrate W is rotated at a high speed, and, as a result, the etching liquid is shaken off from the upper surface of the substrate W, and most of the etching liquid is discharged outwardly from the substrate W, and the solvent component in the etching liquid is evaporated from the upper surface of the substrate W (first rotating/discharging step, first rotating/evaporating step). Thereby, the etching liquid is removed from the upper surface of the substrate W, and the upper surface of the substrate W is dried (first drying step).

It should be noted that the etching liquid remains in the concave portion 100 without being completely removed from the upper surface of the substrate W until the rinsing liquid removing step (Step S7) described later is ended, as is described in detail later.

Figure 6B:
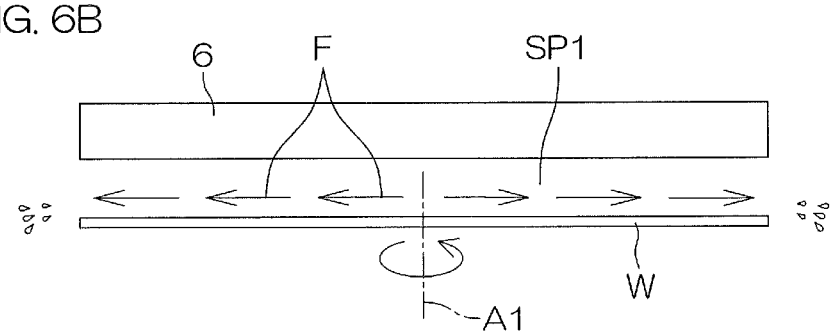
FIG. 6B is a schematic view for describing an aspect of the substrate when the substrate processing is performed.

The evaporation of the solvent component caused by the rotation of the substrate W will be described in detail. A centrifugal force at the high-speed rotation of the substrate W acts not only on the liquid existing on the upper surface of the substrate W but also on an atmosphere contiguous to the upper surface of the substrate W. Therefore, an airflow F directed from the center side of the upper surface of the substrate W toward the peripheral side thereof is created in a space SP1 contiguous to the etching liquid on the substrate W by means of the operation of the centrifugal force of the substrate W as shown in FIG. 6B. Because of this airflow F, a gaseous solvent contiguous to the etching liquid on the substrate W is excluded from on the substrate W. Therefore, the evaporation of the solvent component in the etching liquid is facilitated (first rotating/evaporating step).

In the etching liquid removing step, the facing member 6 is disposed at a decompression position that is closer to the upper surface of the substrate W than to the distant position. The substrate W is rotated at a high speed in a state in which the facing member 6 is placed at the decompression position to create an airflow F, thus making it possible to depress the space SP1 between the facing member 6 and the substrate W. This makes it possible to facilitate the evaporation of the solvent component in the etching liquid (first decompressing/evaporating step).

After the discharge of the etching liquid is stopped, the etching-liquid nozzle 10 is moved to a retreat position by means of the first nozzle moving mechanism 35. The retreat position of the etching-liquid nozzle 10 is a position at which the etching-liquid nozzle 10 is placed outside the processing cup 7 in a plan view without facing the upper surface of the substrate W.

The liquid oxidant supplying step (Step S4) in which a liquid oxidant is supplied to the upper surface of the substrate W is performed after the etching liquid removing step is completed.

Figure 6C:
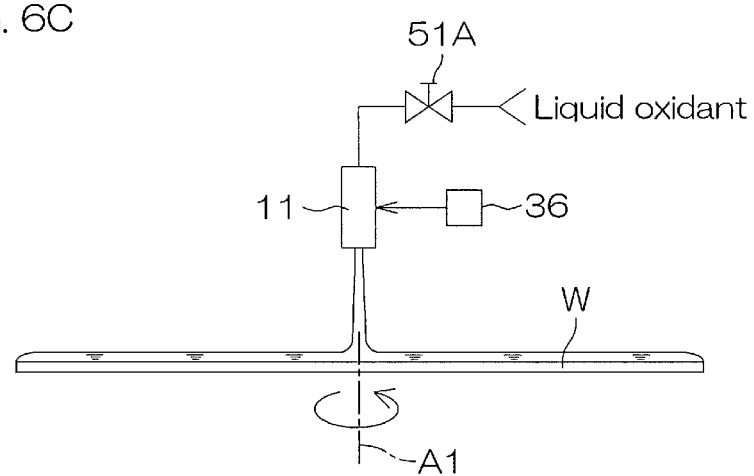
FIG. 6C is a schematic view for describing an aspect of the substrate when the substrate processing is performed.

In detail, the facing-member elevation mechanism 34 places the facing member 6 at the distant position. The second nozzle moving mechanism 36 moves the liquid oxidant nozzle 11 to the processing position in a state in which the facing member 6 is placed at the distant position. Thereafter, the liquid oxidant valve 51A is opened in a state in which the liquid oxidant nozzle 11 is placed at the processing position. Thereby, the liquid oxidant is discharged from the liquid oxidant nozzle 11 toward the upper surface of the substrate W as shown in FIG. 6C (liquid oxidant discharge step). The liquid oxidant discharged from the liquid oxidant nozzle 11 lands on the upper surface of the substrate W. The liquid oxidant is spread entirely on the upper surface of the substrate W by means of the operation of the centrifugal force, and is supplied to the entirety of the upper surface of the substrate W (liquid oxidant supplying step).

In this substrate processing, the processing position of the liquid oxidant nozzle 11 is a center position at which the discharge port faces the central region of the upper surface of the substrate W. Therefore, the liquid oxidant is landed on the central region of the upper surface of the substrate W. Unlike this substrate processing, the liquid oxidant nozzle 11 may discharge a liquid oxidant while horizontally moving along the upper surface of the substrate W.

The discharge of the liquid oxidant is continuously performed at a predetermined discharge flow amount during a predetermined liquid oxidant discharge period. The liquid oxidant discharge period is, for example, not less than 5 seconds and not more than 180 seconds. The discharge flow amount of the liquid oxidant is, for example, not less than 500 mL/min and not more than 2000 mL/min. The substrate W is rotated, for example, at a rotation speed of not less than 300 rpm and not more than 1200 rpm during the discharge of the liquid oxidant.

After the liquid oxidant supplying step is completed, the oxidant removing step (Step S5) in which the liquid oxidant is removed from on the upper surface of the substrate W is performed.

In detail, the liquid oxidant valve 51A is closed, and the discharge of the liquid oxidant is stopped, and the substrate W is rotated at a high speed while the rotation driving member 23 is accelerating the rotation of the substrate W. In the oxidant removing step, the substrate W is rotated at a rotation speed of not less than 1500 rpm and not more than 2500 rpm during a period of, for example, not less than 60 seconds and not more than 180 seconds. The substrate W is rotated at a high speed, and, as a result, the liquid oxidant is shaken off from the upper surface of the substrate W, and most of the liquid oxidant can be discharged outwardly from the substrate W, and the liquid oxidant can be evaporated from the upper surface of the substrate W (second rotating/discharging step, second rotating/evaporating step). Thereby, the liquid oxidant is removed from the upper surface of the substrate W, and the upper surface of the substrate W is dried (second drying step).

In the oxidant removing step, the evaporation of the liquid oxidant is facilitated by an airflow F created by the operation of a centrifugal force at the high-speed rotation of the substrate W in the same way as in the liquid oxidant supplying step. Additionally, likewise, in the oxidant removing step, the facing member 6 may be placed at the decompression position as shown in FIG. 6B (second decompressing/evaporating step).

After the supply of the liquid oxidant is stopped, the liquid oxidant nozzle 11 is moved to a retreat position by means of the second nozzle moving mechanism 36. The retreat position of the liquid oxidant nozzle 11 is a position at which the liquid oxidant nozzle 11 is placed outside the processing cup 7 in a plan view without facing the upper surface of the substrate W.

The rinsing liquid supplying step (Step S6) in which a rinsing liquid is supplied to the upper surface of the substrate W is performed after the liquid oxidant is removed from on the upper surface of the substrate W.

Figure 6D:
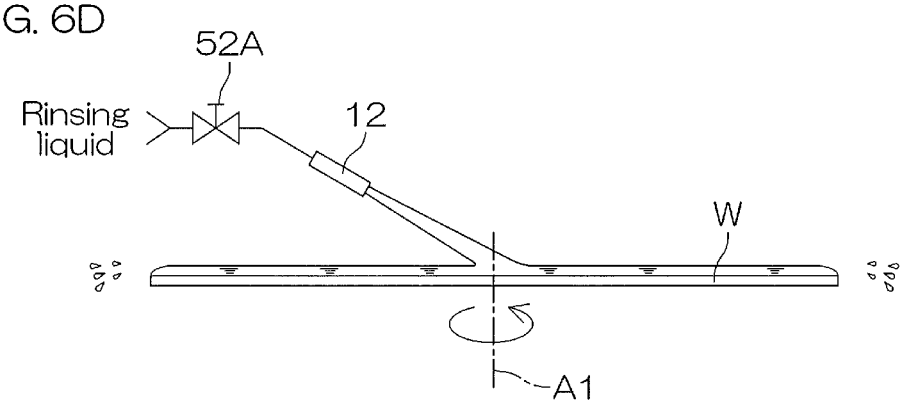
FIG. 6D is a schematic view for describing an aspect of the substrate when the substrate processing is performed.

In detail, the facing-member elevation mechanism 34 places the facing member 6 at the distant position. The rinsing-liquid valve 52A is opened in a state in which the facing member 6 is placed at the distant position. Thereby, a rinsing liquid is discharged from the rinsing-liquid nozzle 12 toward the upper surface of the substrate W as shown in FIG. 6D (rinsing liquid discharge step). The rinsing liquid discharged from the rinsing-liquid nozzle 12 lands on the upper surface of the substrate W. The rinsing liquid is spread entirely on the upper surface of the substrate W by means of the operation of the centrifugal force, and is supplied to the entirety of the upper surface of the substrate W (rinsing liquid supplying step).

The discharge of the rinsing liquid is continuously performed at a predetermined discharge flow amount during a predetermined rinsing liquid discharge period. The rinsing liquid discharge period is, for example, not less than 10 seconds and not more than 180 seconds. The discharge flow amount of the rinsing liquid is, for example, not less than 500 mL/min and not more than 2000 mL/min. The substrate W is rotated, for example, at a rotation speed of not less than 300 rpm and not more than 1200 rpm during the discharge of the rinsing liquid.

After the rinsing liquid supplying step is completed, the rinsing liquid removing step (Step S7) in which the rinsing liquid is removed from on the upper surface of the substrate W is performed.

In detail, the rinsing-liquid valve 52A is closed, and the discharge of the rinsing liquid is stopped, and the substrate W is rotated at a high speed while the rotation driving member 23 is accelerating the rotation of the substrate W. In the rinsing liquid removing step, the substrate W is rotated at a rotation speed of not less than 1500 rpm and not more than 2500 rpm during a period of, for example, not less than 60 seconds and not more than 180 seconds. The substrate W is rotated at a high speed, and, as a result, the rinsing liquid is shaken off from the upper surface of the substrate W, and most of the rinsing liquid can be discharged outwardly from the substrate W, and the solvent component in the rinsing liquid can be evaporated from the upper surface of the substrate W (third rotating/discharging step, third rotating/evaporating step). Thereby, the rinsing liquid is removed from the upper surface of the substrate W, and the upper surface of the substrate W is dried (third drying step).

In the rinsing liquid removing step, the evaporation of the rinsing liquid is facilitated by an airflow F created by the operation of a centrifugal force at the high-speed rotation of the substrate W in the same way as in the etching liquid removing step. Additionally, likewise, in the rinsing liquid removing step, the facing member 6 may be placed at the decompression position as shown in FIG. 6B (third decompressing/evaporating step).

After the rinsing liquid removing step (Step S7) is completed, the facing-member elevation mechanism 34 moves the facing member 6 to the distant position, and the rotation driving member 23 stops the rotation of the substrate W. Thereafter, the transfer robot CR enters the wet processing unit 2W, and receives an already-processed substrate W from the spin chuck 5, and carries the substrate W out of the wet processing unit 2W (substrate carry-out step: Step S8). The substrate W is delivered from the transfer robot CR to the transfer robot IR, and is stored in the carrier CA by means of the transfer robot IR.

FIG. 7 is a schematic view for describing an aspect near the upper surface of a substrate W being subjected to substrate processing.

An etching liquid is supplied to the upper surface of the substrate W in the etching liquid supplying step (Step S2), and, as a result, the metal layer 103 in the concave portion 100 is removed as shown in FIG. 7(a) (etching step). Preferably, the metal layer 103 in the concave portion 100 is completely removed when the etching liquid supplying step is ended as shown in FIG. 7(b).

Thereafter, in the etching liquid removing step (Step S3), an etching liquid 110 is discharged outwardly from the substrate W, and a solvent component in the etching liquid 110 is evaporated. Therefore, the etching liquid is concentrated, and the etching liquid 110 that has been concentrated remains in the concave portion 100 as shown in FIG. 7(c) (concentrating step).

If the width W1 of the concave portion 100 provided at the major surface of the substrate W is 5 nm or less, the concave portion 100 is very narrow. Therefore, the concentration of etching ions 111 of the etching liquid 110 is raised by the evaporation of the solvent component, and, as a result, the vapor pressure of the solvent is lowered. The vapor pressure of the solvent is further lowered at a narrow place, such as the concave portion 100. Therefore, the etching liquid 110 is liable to remain at a bottom portion of the concave portion 100 without being completely removed even after the completion of the etching liquid removing step.

The etching liquid 110 remains in the concave portion 100 because of the evaporation of the solvent component, whereas the side surface 104b of the concave-portion forming surface 104 is exposed. Unlike FIG. 7(c), there is a possibility that a part of the bottom surface 104a of the concave-portion forming surface 104 will be exposed.

After the etching liquid 110 is concentrated, the liquid oxidant supplying step (Step S4) is performed, and a liquid oxidant 112 is supplied to the upper surface of the substrate W as shown in FIG. 7(d). The concave-portion forming surface 104 is exposed by the etching liquid removing step, and therefore it is possible to excellently hydrophilize the concave-portion forming surface 104 (particularly, the side surface 104b) by allowing the liquid oxidant 112 to enter the inside of the concave portion 100 (hydrophilizing step). The liquid oxidant nozzle 11 (see FIG. 3) functions as a hydrophilizing member that hydrophilizes the concave-portion forming surface 104 exposed by the concentration of the etching liquid 110.

Thereafter, the liquid oxidant 112 is removed in the oxidant removing step (Step S5) as shown in FIG. 7(e). The etching ions 111 remain in the concave portion 100 even after the completion of the oxidant removing step.

Thereafter, a rinsing liquid 113 is supplied to the upper surface of the substrate W in the rinsing liquid supplying step (Step S6). Thereby, the rinsing liquid 113 enters the inside of the concave portion 100 as shown in FIG. 7(f).

An air-liquid interface is formed in the concave portion 100 by means of the concentration of the etching liquid 110, and therefore an introducing passage of the rinsing liquid 113 from an opening of the concave portion 100 to the air-liquid interface is in a vapor state. Therefore, the rinsing liquid 113 enters the inside of the concave portion 100 more easily than in a case in which the entirety of the concave portion 100 is filled with a liquid. It should be noted that the movement of the rinsing liquid 113 into the concave portion 100 will be easily restricted if the width W1 of the concave portion 100 is 5 nm or less. However, the side surface 104b of the concave-portion forming surface 104 is hydrophilized by the liquid oxidant 112. Therefore, it is possible to allow the rinsing liquid 113 to smoothly enter the inside of the concave portion 100.

The concave portion 100 whose width W1 is 5 nm or less configures a diffusion layer in which not fluid movement but ionic diffusion is dominant. The rinsing liquid 113 that has entered the inside of the concave portion 100 comes into contact with the etching liquid 110, and therefore a difference (concentration gradient) in ionic concentration between the rinsing liquid 113 and the etching liquid 110 occurs in the concave portion 100. In detail, the etching liquid 110 in which the concentration of the etching ions 111 is high and the rinsing liquid 113 that does not contain the etching ions 111 come into contact with each other. Therefore, the etching ions 111 diffuse into the rinsing liquid 113 as shown in FIG. 7(g) in order to equalize the concentration of the etching ions 111 (ion diffusing step). As thus described, the ion diffusing step is performed in which the etching ions 111 are diffused into the rinsing liquid 113 by supplying the rinsing liquid 113 to the upper surface of the substrate W after the completion of the hydrophilizing step. Before long, most of the etching ions 111 move outwardly from the concave portion 100, and the amount of the etching ions 111 remaining in the concave portion 100 is reduced.

Thereafter, the rinsing liquid is removed from the upper surface of the substrate W in the rinsing liquid removing step (Step S7). The etching ions 111 have diffused into the rinsing liquid 113, and most of the etching ions 111 have been discharged outwardly from the substrate W together with the rinsing liquid 113 in the rinsing liquid supplying step. Therefore, it is possible to remove the rinsing liquid 113 from the concave portion 100 as shown in FIG. 7(h). Furthermore, it is possible to prevent the rinsing liquid 113 from being concentrated and to prevent the etching ions 111 from remaining in the concave portion 100 in the rinsing liquid removing step. As thus described, the rinsing liquid 113 functions as a liquid that diffuses the etching ions 111 into the liquid by generating the concentration gradient of the etching ions 111.

In the above-described substrate processing, the hydrophilization of the concave-portion forming surface 104 performed during the supply of the etching liquid 110 and during the supply of the rinsing liquid 113 is achieved by the supply of the liquid oxidant 112, i.e., by the supply of the liquid. Therefore, the substrate W is not required to be moved to another chamber for hydrophilization unlike a case in which the hydrophilization of the concave-portion forming surface 104 is performed by the supply of a gaseous oxidant or by light irradiation (for example, a second preferred embodiment described later). Therefore, substrate processing can be performed swiftly.

Additionally, in the above-described substrate processing, the liquid oxidant 112 is removed by evaporation from the upper surface of the substrate W before supplying the rinsing liquid 113 to the upper surface of the substrate W. Therefore, it is possible to prevent an oxidant (ozone or hydrogen peroxide) in the liquid oxidant 112 from mixing with the rinsing liquid 113 supplied to the upper surface of the substrate W and to prevent the ionic concentration in the rinsing liquid 113 from rising. Therefore, it is possible to restrain a decrease in ionic concentration gradient between the etching liquid 110 and the rinsing liquid 113 that have been concentrated. As a result, it is possible to restrain the remaining of the etching liquid 110 in the concave portion 100.

Additionally, in the above-described substrate processing, both the supply of the etching liquid 110 to the upper surface of the substrate W and the evaporation of the solvent component of the etching liquid 110 from the upper surface of the substrate W are performed in a state in which the substrate W is being held by the spin chuck 5. Therefore, it is possible to concentrate the etching liquid 110 swiftly after the etching operation is ended. Additionally, it is possible to swiftly concentrate the etching liquid 110 by means of the decompression of the space SP1 contiguous to the upper surface of the substrate W by rotating the spin chuck 5 at a high speed while placing the facing member 6 at the decompression position.

The concentration of the etching liquid 110 is performed mainly by rotating the substrate W by means of the spin chuck 5. Therefore, the spin chuck 5 functions as an etching-liquid concentrating member. Additionally, the removal of the rinsing liquid is also performed mainly by rotating the substrate W by means of the spin chuck 5. Therefore, the spin chuck 5 functions also as a rinsing-liquid removing member.

The diffusion of the etching ions 111 by means of the rinsing liquid 113 can be regarded as the infinite dilution of the etching liquid 110. The dilution speed R by diffusion becomes larger in proportion to an increase in concentration gradient on the basis of Nernst's equation "$R = D \cdot S \cdot (C_0 - C)/\delta$." Herein, "D" designates a diffusion factor, and "S" designates a solid surface area. "$C_0$" designates an ionic concentration in the concentrated etching liquid 110, and "C" designates an ionic concentration in the rinsing liquid 113. "$(C_0 - C)/\delta$" designates a concentration gradient in the diffusion layer.

The displacement efficiency of the etching liquid 110 becomes higher in proportion to an increase in difference between an ionic concentration in the concentrated etching liquid 110 and an ionic concentration in the rinsing liquid 113. Therefore, it is possible to efficiently remove the etching liquid 110 from the concave portion 100 by supplying the rinsing liquid 113 to the substrate W. Additionally, in order to improve the displacement efficiency, it is preferable to use water, which does not contain ions as much as possible, as the rinsing liquid 113, and it is particularly preferable to use DIW.

FIG. 8 is a flowchart for describing another example of the substrate processing according to a first preferred embodiment. In the substrate processing shown in FIG. 8, after the rinsing liquid removing step (Step S7) is completed, the rinsing liquid supplying step (Step S6) and the rinsing liquid removing step (Step S7) are each repeatedly performed further at least once. In other words, the rinsing liquid supplying step (ion diffusing step) and the rinsing liquid removing step are alternately performed a plurality of times. In detail, in the rinsing liquid removing step, the rinsing liquid is discharged outwardly from the substrate W, and then the rinsing liquid is again supplied from the rinsing-liquid nozzle 12 toward the upper surface of the substrate W. "N" in FIG. 8 designates a natural number equal to or more than 1.

According to the substrate processing of this modification, it is possible to perform the diffusion by the rinsing liquid 113 a plurality of times. Therefore, it is possible to sufficiently remove the etching ions 111 remaining in the concave portion 100 even when the etching ions 111 remaining in the concave portion 100 cannot be sufficiently removed by the diffusion by means of the rinsing liquid 113 once.

<Configuration of Substrate Processing Apparatus According to Second Preferred Embodiment>

Figure 9:
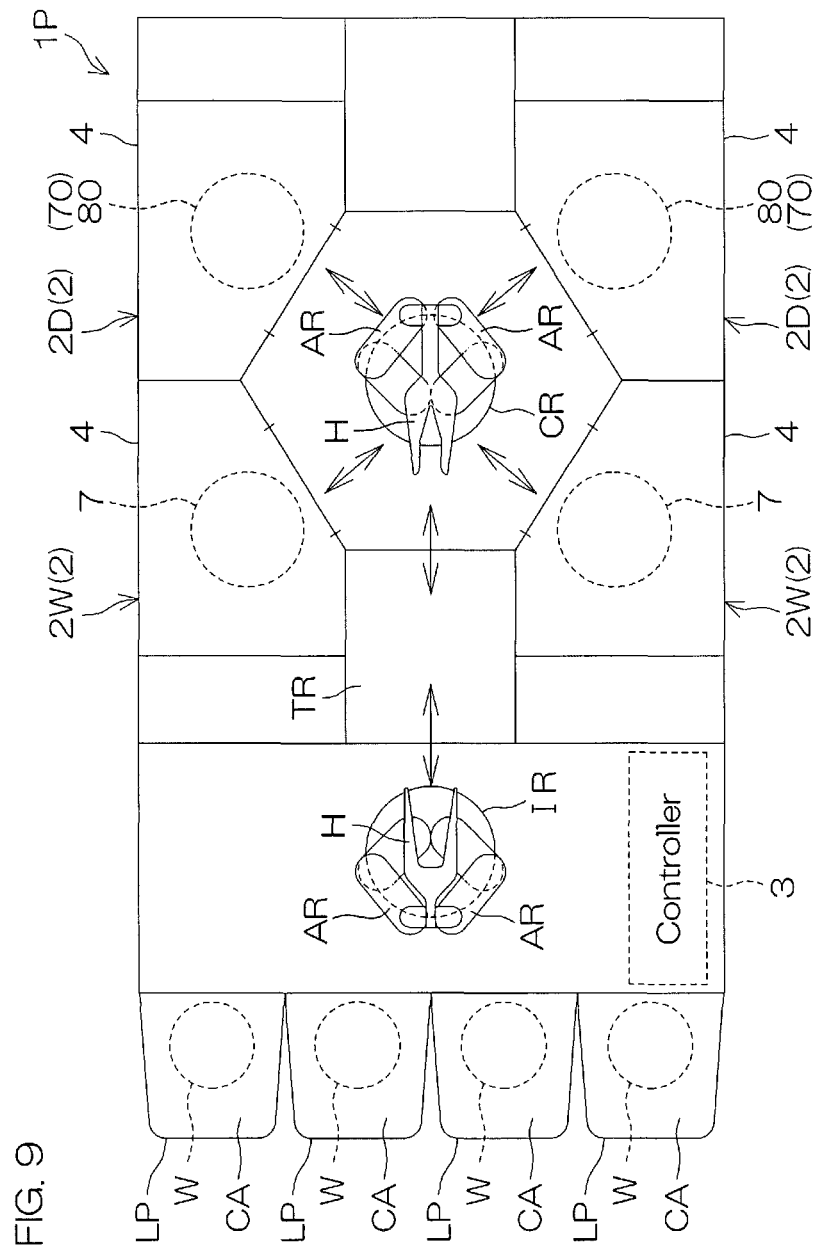
FIG. 9 is a plan view for describing a configuration of a substrate processing apparatus according to a second preferred embodiment of the present invention.

FIG. 9 is a plan view for describing a configuration of a substrate processing apparatus 1P according to a second preferred embodiment of the present invention.

The substrate processing apparatus 1P according to the second preferred embodiment differs from the substrate processing apparatus 1 (see FIG. 3) according to the first preferred embodiment mainly in that the processing unit 2 includes the wet processing unit 2W and the dry processing units 2D. In FIG. 9, the same reference sign as in FIG. 1 and in the other drawings is assigned to a constituent equivalent to each constituent shown in FIG. 1 to FIG. 8, and a description of this constituent is omitted. The same applies to FIGS. 10 to 14 described later.

In an example shown in FIG. 9, two processing towers on the transfer-robot-IR side are configured by a plurality of wet processing units 2W, and two processing towers on the side opposite to the transfer robot IR are configured by a plurality of dry processing units 2D. The configuration of the wet processing unit 2W according to the second preferred embodiment is the same as the configuration of the wet processing unit 2W according to the first preferred embodiment (configuration shown in FIG. 3). In the wet processing unit 2W according to the second preferred embodiment, the liquid oxidant nozzle 11 (see FIG. 3 and the like) can be omitted. The dry processing unit 2D is disposed in the chamber 4, and includes a gas oxidation treatment unit 80 that oxidizes a substrate W by means of a gaseous oxidant.

Figure 10:
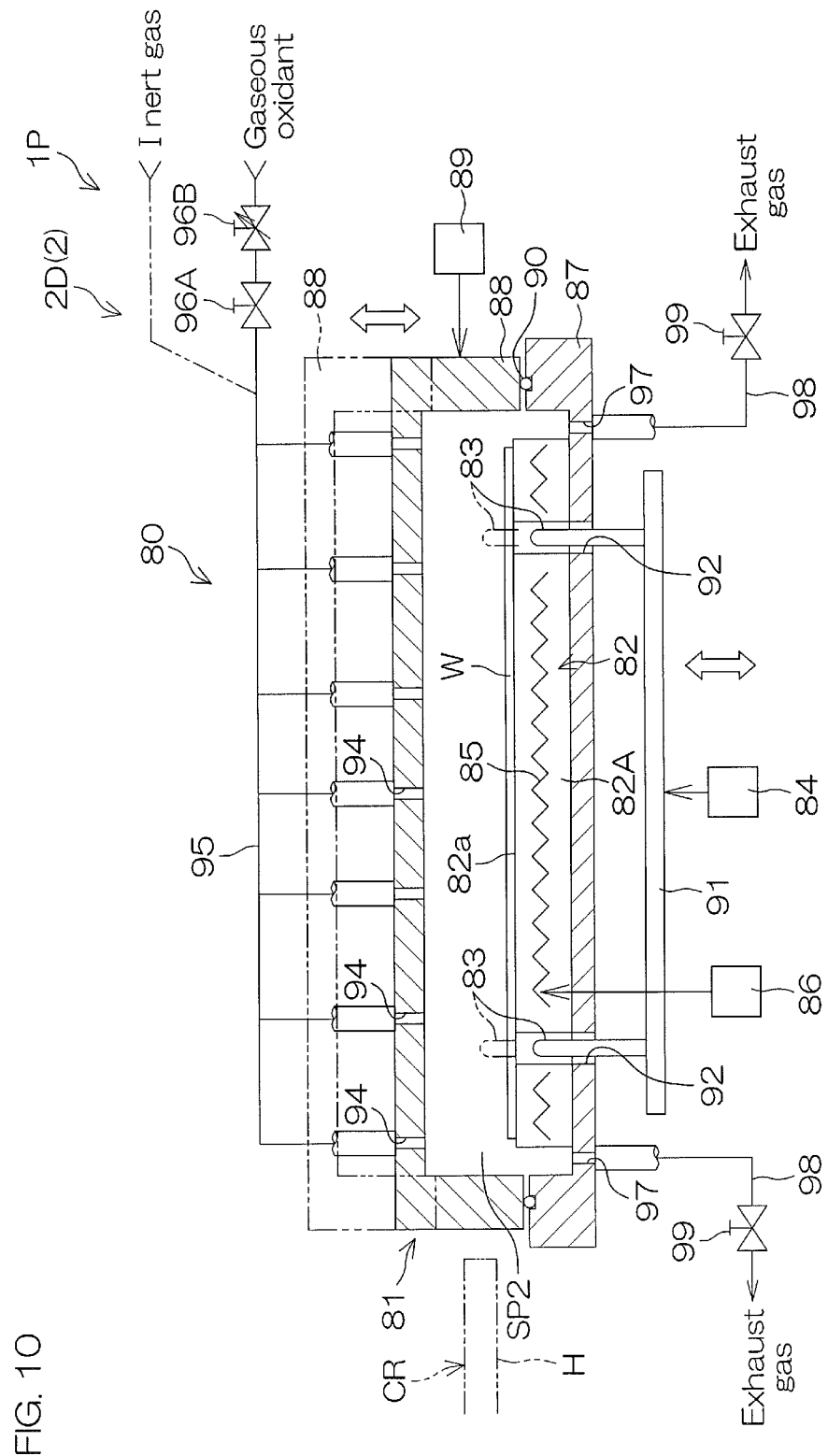
FIG. 10 is a schematic cross-sectional view for describing a gas oxidation treatment unit included in the substrate processing apparatus according to the second preferred embodiment.

FIG. 10 is a schematic cross-sectional view for describing a configuration example of the gas oxidation treatment unit 80. The gas oxidation treatment unit 80 is provided with a heater unit 82 having a heating surface 82a on which a substrate W is placed and a heat treatment chamber 81 that houses the heater unit 82.

The heater unit 82 has a form of a disk-shaped hot plate. The heater unit 82 includes a plate body 82A and a heater 85. The heater unit 82 is referred to also as a heating member.

An upper surface of the plate body 82A configures the heating surface 82a. The heater 85 may be a resistive element built in the plate body 82A. The heater 85 can heat a substrate W to a temperature substantially equal to the temperature of the heater 85. The heater 85 is configured to be able to heat the substrate W placed on the heating surface 82a, for example, within a temperature range of not less than a normal temperature and not more than 400° C. In detail, an energizing mechanism 86, such as a power source, is connected to the heater 85, and an electric current supplied from the energizing mechanism 86 is adjusted, and, as a result, the temperature of the heater 85 is changed to a temperature within the temperature range.

The heat treatment chamber 81 is provided with a chamber main body 87 that is upwardly opened and a lid 88 that moves in an up-down direction above the chamber main body 87 and that closes an opening of the chamber main body 87. The gas oxidation treatment unit 80 is provided with a lid elevation driving mechanism 89 that raises and lowers the lid 88 (that moves the lid 88 in the up-down direction). A space between the chamber main body 87 and the lid 88 is sealed up with an elastic member 90 such as an O ring.

The lid 88 is moved upwardly and downwardly between a lower position (position shown by a solid line in FIG. 10) at which the opening of the chamber main body 87 is closed so as to form a sealed processing space SP2 inside the chamber main body 87 and an upper position to which the lid 88 recede upwardly so as to open the opening by means of the lid elevation driving mechanism 89. The sealed processing space SP2 is a space contiguous to the upper surface of the substrate W. A hand H of the transfer robot CR is accessible to the inside of the heat treatment chamber 81 when the lid 88 is placed at the upper position.

The substrate W is placed on the heater unit 82, and, as a result, is horizontally held at a predetermined second holding position. The second holding position is a position of the substrate W shown in FIG. 10, and is a position at which the substrate W is held in a horizontal attitude.

The lid elevation driving mechanism 89 may have an electric motor or an air cylinder, or may have an actuator other than these devices.

The gas oxidation treatment unit 80 is additionally provided with a plurality of lift pins 83 that move upwardly and downwardly through the plate body 82A and a pin elevation driving mechanism 84 that moves the lift pins 83 in the up-down direction. The lift pins 83 are connected together by means of a connection plate 91. The pin elevation driving mechanism 84 raises and lowers the connection plate 91, and, as a result, the lift pins 83 are moved upwardly and downwardly between an upper position (position shown by an alternate long and two short dashed line in FIG. 10) at which the substrate W is held at a position higher than the heating surface 82a and a lower position (position shown by a solid line in FIG. 10) at which a forward end portion (upper end portion) of the pin is immersed into a space lower than the heating surface 82a. The pin elevation driving mechanism 84 may have an electric motor or an air cylinder, or may have an actuator other than these devices.

The lift pins 83 are inserted in a plurality of through-holes 92, respectively, each of which passes through the heater unit 82 and the chamber main body 87. The entry of a fluid into the through-hole 92 from the outside of the heat treatment chamber 81 may be prevented by bellows (not shown), or the like, surrounding the lift pin 83.

The gas oxidation treatment unit 80 is provided with a plurality of gas admission ports 94 that admit a gaseous oxidant into the sealed processing space SP2 in the heat treatment chamber 81. Each of the gas admission ports 94 is a through-hole that passes through the lid 88.

The gaseous oxidant is an example of a hydrophilizing gas that hydrophilizes the major surface of the substrate W. For example, the gaseous oxidant is an ozone ($O_3$) gas. The gaseous oxidant may be, for example, an oxidative water vapor, a superheated water vapor, or the like without being limited to the ozone gas.

A gaseous oxidant pipe 95 that supplies a gaseous oxidant to the gas admission port 94 is connected to the gas admission ports 94. The gaseous oxidant pipe 95 branches off on the way from a gaseous oxidant supply source (not shown) toward the gas admission ports 94. A gaseous oxidant valve 96A that opens and closes a flow path of the gaseous oxidant pipe 95 and a gaseous oxidant flow-rate adjusting valve 96B that adjusts the flow rate of the gaseous oxidant in the gaseous oxidant pipe 95 are interposed in the gaseous oxidant pipe 95.

When the gaseous oxidant valve 96A is opened, the gaseous oxidant is admitted into the sealed processing space SP2 from the gas admission ports 94, and the gaseous oxidant is supplied toward the upper surface of the substrate W. The gas admission ports 94 are one example of a gaseous oxidant supply member.

The gas admission ports 94 may be configured to be able to supply an inert gas in addition to the gaseous oxidant (see the alternate long and two short dashed line of FIG. 10). Additionally, the inert gas can be mixed with the gaseous oxidant admitted into the sealed processing space SP2, and the concentration (partial pressure) of an oxidant can be adjusted by the mixing degree of the inert gas.

The gas oxidation treatment unit 80 is provided with a plurality of discharge ports 97 that are formed in the chamber main body 87 and from which an internal atmosphere of the heat treatment chamber 81 is discharged. A discharge pipe 98 is connected to each of the discharge ports 97, and a discharge valve 99 that opens and closes a flow path of the discharge pipe 98 is interposed in the discharge pipe 98.

<One Example of Substrate Processing According to Second Preferred Embodiment>

Figure 11:
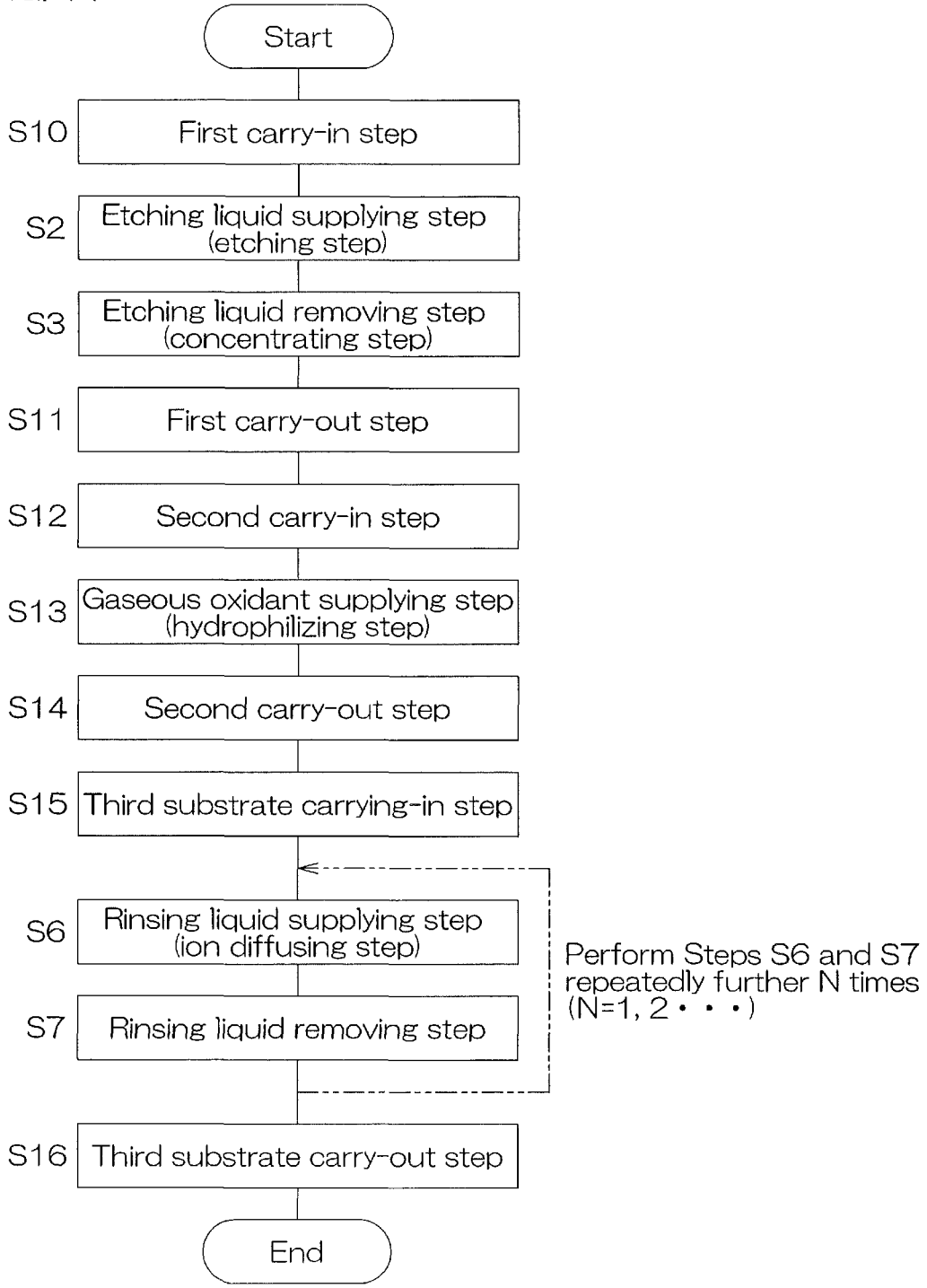
FIG. 11 is a flowchart for describing an example of substrate processing performed by the substrate processing apparatus according to the second preferred embodiment.

FIG. 11 is a flowchart for describing an example of substrate processing performed by the substrate processing apparatus 1P according to the second preferred embodiment. The substrate processing according to the second preferred embodiment differs from the substrate processing (see FIG. 5) according to the first preferred embodiment mainly in that the substrate W is hydrophilized by the dry processing unit 2D.

Referring mainly to FIG. 10 and FIG. 11, a difference between the substrate processing according to the second preferred embodiment and the substrate processing (see FIG. 5) according to the first preferred embodiment will be hereinafter described in detail.

First, a not-yet-processed substrate W is carried from the carrier CA into the wet processing unit 2W by means of the transfer robots IR and CR (see FIG. 9), and is delivered to the spin chuck 5 (first carrying-in step: Step S10). Thereby, the substrate W is horizontally held by the spin chuck 5 (first substrate holding step). Thereafter, the etching liquid supplying step (Step S2) and the etching liquid removing step (Step S3) are performed as shown in FIG. 6A and FIG. 6B.

After the etching liquid removing step is completed, the transfer robot CR enters the wet processing unit 2W, and receives the substrate W from the spin chuck 5, and carries it out of the wet processing unit 2W (first carrying-out step: Step S11). The substrate W carried out from the wet processing unit 2W is carried into the dry processing unit 2D by means of the transfer robot CR, and is delivered to the lift pins 83 placed at the upper position (second carrying-in step: Step S12). The pin elevation driving mechanism 84 moves the lift pins 83 to the lower position, and, as a result, the substrate W is placed on the heating surface 82a. Thereby, the substrate W is horizontally held (second substrate holding step).

Thereafter, the lid 88 is lowered, and, as a result, a state is reached in which the substrate W is placed on the heating surface 82a of the heater unit 82 in the sealed processing space SP2 formed by both the chamber main body 87 and the lid 88. The substrate W placed on the heating surface 82a is heated to a predetermined oxidizing temperature by means of the heater unit 82 (substrate heating step, heater heating step). The predetermined oxidizing temperature is a temperature of, for example, not less than 100° C. and not more than 400° C.

The gaseous oxidant valve 96A is opened in a state in which the sealed processing space SP2 is formed. Thereby, gas oxidation treatment is performed. In detail, a gaseous oxidant, such as ozone gas, is admitted from the gas admission ports 94 into the sealed processing space SP2, and the gaseous oxidant is supplied toward the upper surface of the substrate W (gaseous oxidant supplying step: Step S13). Thereby, the concave-portion forming surface 104 (particularly, the side surface 104b) is oxidized, which is described in detail later (gas oxidation step and dry oxidation step). In other words, the concave-portion forming surface 104 (particularly, the side surface 104b) is hydrophilized (hydrophilizing step). The gas admission ports 94 function as a hydrophilizing member that hydrophilizes the concave-portion forming surface 104 exposed by the concentration of the etching liquid 110.

The substrate W is heated to an oxidizing temperature on the heater unit 82. Therefore, the heating oxidation step of supplying the gaseous oxidant toward the upper surface of the substrate W while heating the substrate W to the oxidizing temperature is performed in the gaseous oxidant supplying step.

The discharge valve 99 is opened during the supply of the gaseous oxidant. Therefore, the gaseous oxidant in the sealed processing space SP2 is discharged from the discharge pipe 98.

After the upper surface of the substrate W is processed with the gaseous oxidant, the gaseous oxidant valve 96A is closed. Thereby, the supply of the gaseous oxidant into the sealed processing space SP2 is stopped. Thereafter, the lid 88 moves to the upper position.

After the gas oxidation treatment is performed during a fixed period of time, the transfer robot CR enters the dry processing unit 2D, and receives the oxidized substrate W from a base 72, and carries it out of the dry processing unit 2D (second carrying-out step: Step S14). In detail, the pin elevation driving mechanism 84 moves the lift pins 83 to the upper position, and the lift pins 83 lift the substrate W from the heater unit 82. The transfer robot CR receives the substrate W from the lift pins 83.

The substrate W carried out of the dry processing unit 2D is carried into the wet processing unit 2W by means of the transfer robot CR, and is delivered to the spin chuck 5 (third carrying-in step: Step S15). Thereby, the substrate W is horizontally held by the spin chuck 5 (third substrate holding step). The rotation driving member 23 starts the rotation of the substrate W in a state in which the substrate W is being held by the spin chuck 5 (substrate rotating step).

Thereafter, the rinsing liquid supplying step (Step S6) and the rinsing liquid removing step (Step S7) are performed as shown in FIG. 6C and FIG. 6D.

Thereafter, the rotation driving member 23 stops the rotation of the substrate W. The transfer robot CR enters the wet processing unit 2W, and receives the substrate W from the chuck pins 20, and carries it out of the wet processing unit 2W (third carrying-out step: Step S16). The substrate W is delivered from the transfer robot CR to the transfer robot IR, and is housed in the carrier CA by means of the transfer robot IR.

Figure 12:
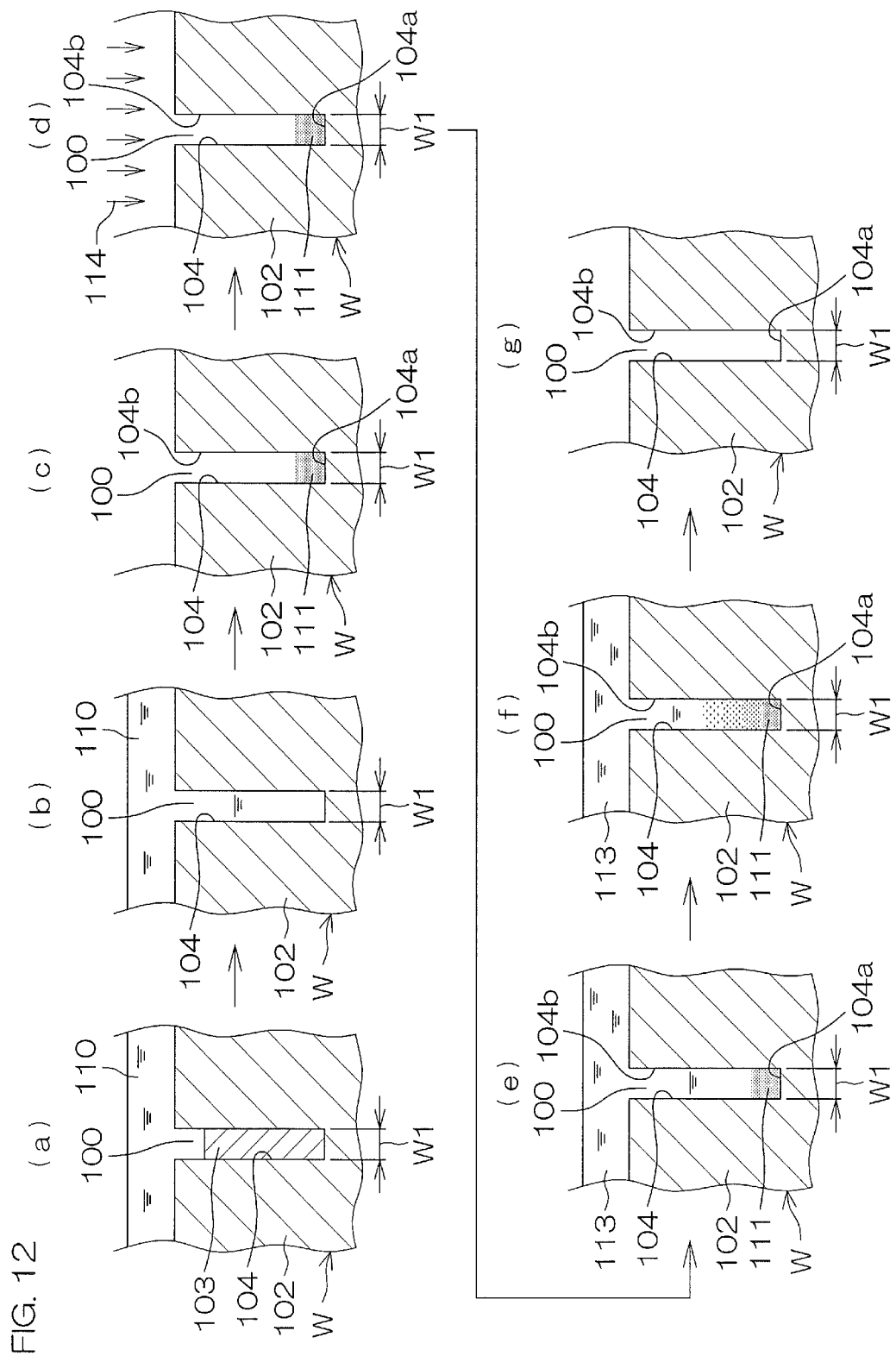
FIG. 12 is a schematic view for describing an aspect near an upper surface of a substrate being subjected to substrate processing according to the second preferred embodiment.

FIG. 12 is a schematic view for describing an aspect near the upper surface of the substrate W being subjected to substrate processing according to the second preferred embodiment. In the substrate processing according to the second preferred embodiment, a gaseous oxidant is used to oxidize the major surface of the substrate W unlike the substrate processing according to the first preferred embodiment.

An etching liquid is supplied to the upper surface of the substrate W in the etching liquid supplying step (Step S2), and, as a result, the metal layer 103 in the concave portion 100 is removed as shown in FIG. 12(a) (etching step). Preferably, the metal layer 103 in the concave portion 100 is completely removed when the etching liquid supplying step is ended as shown in FIG. 12(b).

Thereafter, in the etching liquid removing step (Step S3), the etching liquid 110 is discharged outwardly from the substrate W, and the solvent component in the etching liquid 110 is evaporated. Therefore, the etching liquid is concentrated, and the etching liquid 110 that has been concentrated remains in the concave portion 100 as shown in FIG. 12(c) (concentrating step).

If the width W1 of the concave portion 100 provided at the major surface of the substrate W is 5 nm or less, the concave portion 100 is very narrow, and the etching liquid 110 is liable to remain at the bottom portion of the concave portion 100 as described also in the first preferred embodiment.

The etching liquid 110 remains in the concave portion 100 because of the evaporation of the solvent component, whereas the side surface 104b of the concave-portion forming surface 104 is exposed. Unlike the case of FIG. 12(c), there can be a case in which a part of the bottom surface 104a of the concave-portion forming surface 104 is exposed. After the etching liquid 110 is concentrated, the substrate W is transferred from the wet processing unit 2W to the dry processing unit 2D. The gaseous oxidant supplying step (Step S13) is performed by the dry processing unit 2D, and a gaseous oxidant 114 is supplied to the upper surface of the substrate W as shown in FIG. 12(d). The concave-portion forming surface 104 is exposed through the etching liquid removing step, and therefore it is possible to excellently hydrophilize the concave-portion forming surface 104 (particularly, side surface 104b) by allowing the gaseous oxidant 114 to enter the inside of the concave portion 100 (hydrophilizing step).

Thereafter, the substrate W is transferred from the dry processing unit 2D to the wet processing unit 2W. Thereafter, the rinsing liquid 113 is supplied to the upper surface of the substrate W in the rinsing liquid supplying step (Step S6). Thereby, the rinsing liquid 113 enters the inside of the concave portion 100 as shown in FIG. 12(e).

An air-liquid interface is formed in the concave portion 100 by concentrating the etching liquid 110, and therefore an introducing passage of the rinsing liquid from the opening of the concave portion 100 to the air-liquid interface is in a vapor state. Therefore, the rinsing liquid 113 enters the inside of the concave portion 100 more easily than in a case in which the entirety of the concave portion 100 is filled with a liquid. It should be noted that the movement of the rinsing liquid 113 into the concave portion 100 will be easily restricted if the width W1 of the concave portion 100 is 5 nm or less. However, the side surface 104b of the concave-portion forming surface 104 is hydrophilized by the gaseous oxidant 114. Therefore, it is possible to allow the rinsing liquid 113 to smoothly enter the inside of the concave portion 100.

The concave portion 100 whose width W1 is 5 nm or less is a diffusion layer in which not fluid movement but ionic diffusion is dominant. The rinsing liquid 113 that has entered the inside of the concave portion 100 comes into contact with the etching liquid 110, and therefore a difference (concentration gradient) in ionic concentration between the rinsing liquid 113 and the etching liquid 110 occurs. In detail, the etching liquid 110 in which the concentration of the etching ions 111 is high and the rinsing liquid 113 that does not contain the etching ions 111 come into contact with each other. Therefore, the etching ions 111 diffuse into the rinsing liquid 113 as shown in FIG. 12(f) in order to equalize the concentration of the etching ions 111 (ion diffusing step). As thus described, the ion diffusing step is performed in which the etching ions 111 are diffused into the rinsing liquid 113 by supplying the rinsing liquid 113 to the upper surface of the substrate W after the completion of the hydrophilizing step. Before long, most of the etching ions 111 move outwardly from the concave portion 100, and the amount of the etching ions 111 remaining in the concave portion 100 is reduced.

Thereafter, the rinsing liquid is removed from the upper surface of the substrate W in the rinsing liquid removing step (Step S7). Therefore, it is possible to remove the rinsing liquid 113 from the concave portion 100 as shown in FIG. 12(g). The etching ions 111 have diffused into the rinsing liquid 113, and most of the etching ions 111 have been discharged outwardly from the substrate W together with the rinsing liquid 113 in the rinsing liquid supplying step. Therefore, it is possible to prevent the rinsing liquid 113 from being concentrated and to prevent the etching ions 111 from remaining in the concave portion 100.

As thus described, it is possible to hydrophilize the concave-portion forming surface 104 without using a liquid in the substrate processing according to the second preferred embodiment. Therefore, it is possible to prevent a rise in ionic concentration in the rinsing liquid 113 caused by allowing a liquid (liquid oxidant of the first preferred embodiment) used to hydrophilize the substrate W to be mixed with the rinsing liquid 113.

Additionally, in the above-described substrate processing, both the supply of the etching liquid 110 to the upper surface of the substrate W and the evaporation of the solvent component of the etching liquid 110 from the upper surface of the substrate W are performed in a state in which the substrate W is being held by the spin chuck 5. Therefore, it is possible to concentrate the etching liquid 110 swiftly after the etching operation is ended. Additionally, it is possible to swiftly concentrate the etching liquid by means of the decompression of the space SP1 contiguous to the upper surface of the substrate W by rotating the spin chuck 5 at a high speed while placing the facing member 6 at the decompression position.

<Modification of Dry Processing Unit>

Figure 13:
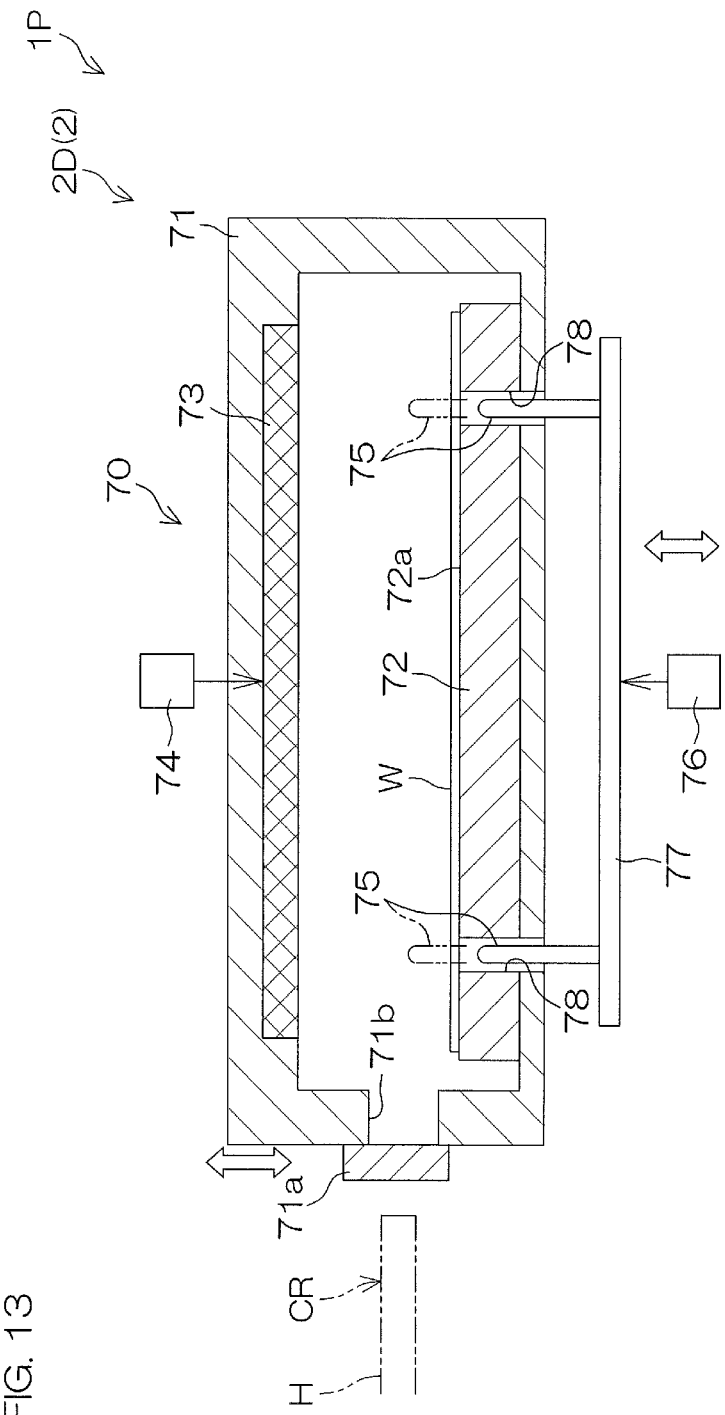
FIG. 13 is a schematic cross-sectional view for describing a configuration example of a light irradiation treatment unit included in the substrate processing apparatus according to the second preferred embodiment.

The dry processing unit 2D may be provided with a light irradiation treatment unit 70 that oxidizes the substrate W by generating an oxidant by means of light irradiation, instead of the gas oxidation treatment unit 80. FIG. 13 is a schematic cross-sectional view for describing a configuration example of the light irradiation treatment unit 70.

The light irradiation treatment unit 70 is provided with a base 72 having a placing surface 72a on which a substrate W is placed, an optical processing chamber 71 that houses the base 72, a light irradiation member 73 that irradiates light, such as ultraviolet rays, toward the upper surface of the substrate W placed on the placing surface 72a, a plurality of lift pins 75 that move upwardly and downwardly through the base 72, and a pin elevation driving mechanism 76 that moves the lift pins 75 in the up-down direction.

A carry-in/out opening 71a for a substrate W is formed in a sidewall of the optical processing chamber 71, and the optical processing chamber 71 has a gate valve 71b that opens and closes the carry-in/out opening 71a. When the carry-in/out opening 71a is opened, the hand H of the transfer robot CR is accessible to the optical processing chamber 71. In this modification, the substrate W is horizontally held at a predetermined second holding position by being placed on the base 72. The second holding position is a position of the substrate W shown in FIG. 13, and is a position at which the substrate W is held in a horizontal attitude.

For example, the light irradiation member 73 includes a plurality of light irradiation lamps. The light irradiation lamp is, for example, a xenon lamp, a mercury lamp, a heavy hydrogen lamp, or the like. The light irradiation member 73 is configured to irradiate ultraviolet rays of, for example, not less than 1 nm and not more than 400 nm, preferably, not less than 1 nm and not more than 300 nm. In detail, an energizing mechanism 74, such as a power source, is connected to the light irradiation member 73, and the light irradiation member 73 (in detail, the light irradiation lamp of the light irradiation member 73) irradiates light by being supplied with electric power from the energizing mechanism 74.

Ozone is generated in an atmosphere contiguous to the major surface of the substrate W by means of light irradiation, and the upper surface of the substrate W is oxidized by the ozone.

The lift pins 75 are inserted in a plurality of through-holes 78, respectively, that pass through both the base 72 and the optical processing chamber 71. The lift pins 75 are connected together by means of a connection plate 77. The lift pins 75 are moved upwardly and downwardly between an upper position (position shown by an alternate long and two short dashed line in FIG. 13) at which the substrate W is supported higher than the placing surface 72a and a lower position (position shown by a solid line in FIG. 13) at which a forward end portion (upper end portion) of the pin is immersed into a space lower than the placing surface 72a by allowing the pin elevation driving mechanism 76 to raise and lower the connection plate 77. The pin elevation driving mechanism 76 may have an electric motor or an air cylinder, or may have an actuator other than these devices.

<Another Example of Substrate Processing According to Second Preferred Embodiment>

Figure 14:
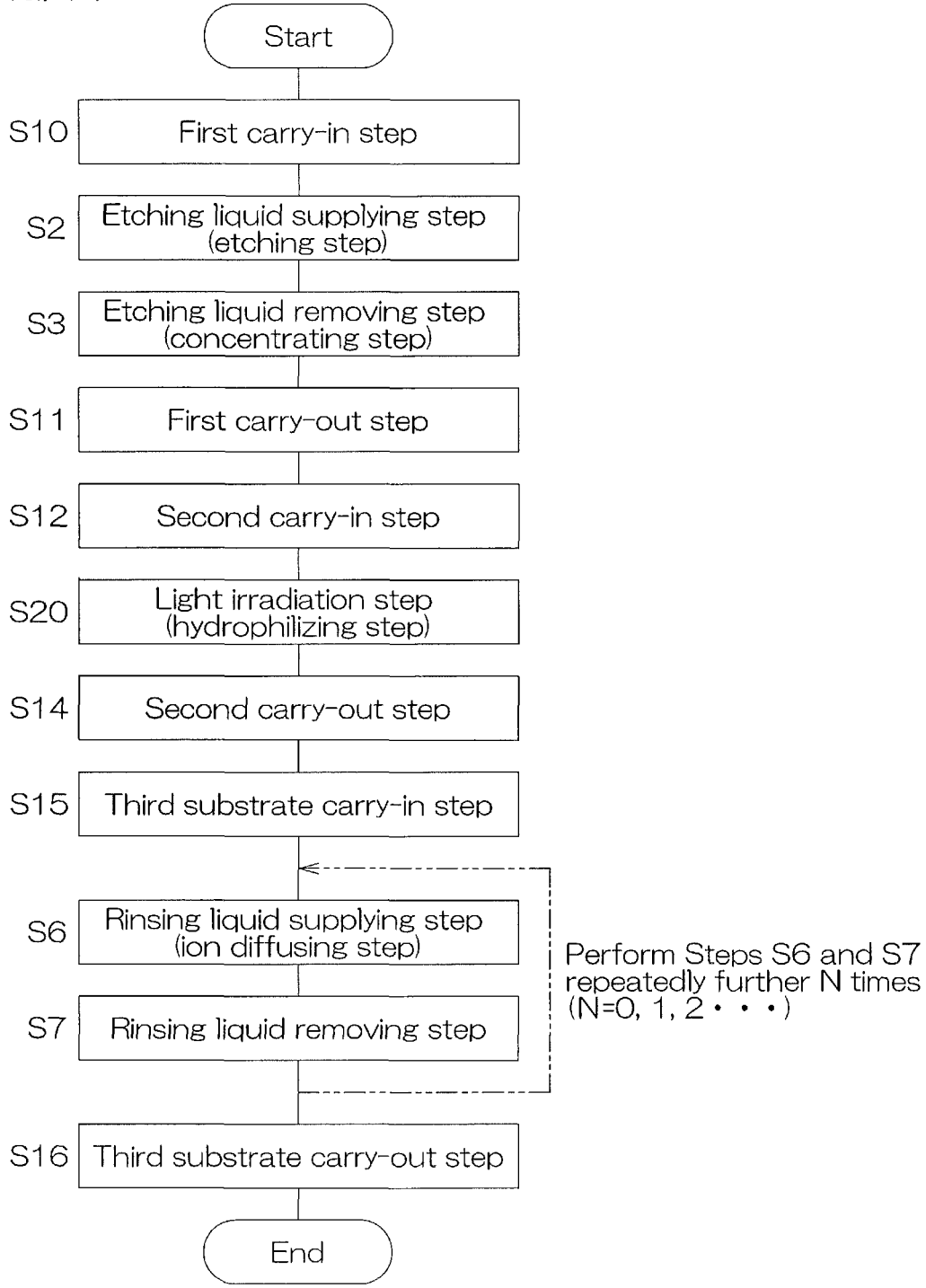
FIG. 14 is a flowchart for describing another example of substrate processing performed by the substrate processing apparatus according to the second preferred embodiment.

FIG. 14 is a flowchart for describing another example of substrate processing according to the second preferred embodiment. The substrate processing shown in FIG. 14 differs from the substrate processing shown in FIG. 11 in that a light irradiation step (Step S20) is performed as the dry oxidation step, instead of the gaseous oxidant supplying step (Step S13).

Referring mainly to FIG. 13 and FIG. 14, the substrate processing shown in FIG. 14 will be hereinafter described centering on a difference with the substrate processing shown in FIG. 11.

Each step from the first carrying-in step (Step S10) to the first carrying-out step (Step S12) is the same as the substrate processing shown in FIG. 11.

A substrate W carried out of the wet processing unit 2W is carried into the dry processing unit 2D by means of the transfer robot CR, and is delivered to the lift pins 75 placed at the upper position (second carrying-in step: Step S12). The substrate W is placed on the placing surface 72a by allowing the pin elevation driving mechanism 76 to move the lift pins 75 to the lower position. Thereby, the substrate W is horizontally held (second substrate holding step).

The transfer robot CR recedes outwardly from the dry processing unit 2D, and thereafter the light irradiation step (Step S20) of irradiating light to the upper surface of the substrate W is performed. In detail, the energizing mechanism 74 supplies electric power to the light irradiation member 73, and, as a result, light irradiation onto the substrate W is started. Thereby, the concave-portion forming surface 104 (particularly, the side surface 104b) is oxidized (light irradiation step, dry oxidation step). In other words, the concave-portion forming surface 104 (particularly, the side surface 104b) is hydrophilized (hydrophilizing step). The light irradiation member 73 functions as a hydrophilizing member that hydrophilizes the concave-portion forming surface 104 exposed by concentrating the etching liquid 110.

In the substrate processing of the modification shown in FIG. 14, an aspect near the upper surface of the substrate W during substrate processing is the same as in FIG. 12 except that the concave-portion forming surface 104 is hydrophilized by irradiation of light such as ultraviolet rays. In detail, light irradiation, such as ultraviolet irradiation, is performed instead of the supply of gaseous oxidant 114 in the substrate processing shown in FIG. 14 although the gaseous oxidant 114 is supplied in FIG. 12(d).

As described above, wet oxidation by means of a liquid oxidant (substrate processing according to the first preferred embodiment) or dry oxidation by means of either light irradiation or a gaseous oxidant (substrate processing according to the second preferred embodiment) can be selected if necessary.

In the substrate processing according to the second preferred embodiment, after the rinsing liquid removing step (Step S7) is completed, the rinsing liquid supplying step (Step S6) and the rinsing liquid removing step (Step S7) may be each repeatedly performed further at least once in the same way as the substrate processing according to the first preferred embodiment as shown in FIG. 11 and FIG. 14 by the alternate long and two short dashed line.

Other Preferred Embodiments

The present invention is not limited to the preferred embodiment described above but can further be implemented in other modes.

Substrate processing according to each of the preferred embodiments described above can be performed even if the short side (width W1) of the concave portion 100 is larger than, for example, 5 nm. However, if the short side (width W1) of the concave portion 100 is 5 nm or less, an etching liquid is liable to remain in the concave portion 100 in the etching liquid removing step, and therefore it is particularly useful to diffuse etching ions into a rinsing liquid by use of the substrate processing according to each of the preferred embodiments described above.

Additionally, in the etching liquid removing step (Step S3), the etching liquid is not necessarily required to be shaken off by rotating the substrate W. For example, the inside of the chamber 4 of the wet processing unit 2W may be decompressed, and the solvent component in the etching liquid may be evaporated (decompressing/evaporating step). Alternatively, after the etching liquid supplying step is completed, the substrate W may be transferred to the heat treatment chamber 81 of the dry processing unit 2D, and the solvent component of the etching liquid may be evaporated in the heat treatment chamber 81 (decompressing/evaporating step). In this case, there is a need to provide a decompressing device (not shown), such as a vacuum pump, that decompresses a space in the heat treatment chamber 81.

In the etching liquid removing step (Step S3), the substrate W may be heated while decompressing the heat treatment chamber 81, or the substrate W may be heated without decompressing the inside of the heat treatment chamber 81 (heating evaporation step).

Additionally, substrate processing in each of the preferred embodiments described above is applied to the upper surface of the substrate W. However, substrate processing in each preferred embodiment may be applied to the lower surface of the substrate W.

Additionally, the processing unit 2 may have a plurality of processing-liquid storage tanks that store an etching liquid, a liquid oxidant, and a rinsing liquid, respectively, instead of both the wet processing unit 2W and the dry processing unit 2D. In other words, the substrate processing apparatus 1 may be a batch type substrate processing apparatus. In that case, substrate processing can be performed by sequentially soaking the substrate W in the processing liquid stored in each of the processing-liquid storage tanks.

It should be noted that the terms "horizontal" and "vertical" have been used in the preferred embodiments described above, and yet these are not required to be precisely "horizontal" and precisely "vertical." In other words, these terms permit an error in manufacturing accuracy, installing accuracy, etc.

While the preferred embodiments of the present invention have been described in detail, these are merely specific examples used to clarify the technical content of the present invention and the present invention should not be interpreted as being limited to these specific examples, and the scope of the present invention shall be limited only by the appended claims.

This application corresponds to Japanese Patent Application No. 2021-045187 filed on Mar. 18, 2021, with the Japan Patent Office, and the entire disclosure of this application is incorporated herein by reference.

REFERENCE SIGNS LIST

1: Substrate processing apparatus
1P: Substrate processing apparatus
5: Spin chuck (substrate holding member, etching-liquid concentrating member, and rinsing-liquid removing member)
10: Etching liquid nozzle (etching liquid supply member)
11: Liquid oxidant nozzle (hydrophilizing member)
12: Rinsing-liquid nozzle (rinsing liquid supply member)
73: Light irradiation member (hydrophilizing member)
94: Gas admission port (hydrophilizing member)
100: Concave portion
103: Metal layer (to-be-removed layer)
104: Concave-portion forming surface
110: Etching liquid
111: Etching ion
112: Liquid oxidant
113: Rinsing liquid
114: Gaseous oxidant
A1: Rotational axis
W: Substrate

The invention claimed is:

1. A substrate processing method for processing a substrate, the substrate having a major surface including a concave-portion forming surface that forms a concave portion, the substrate having a to-be-removed layer formed in the concave portion, the substrate processing method comprising:
   supplying an etching liquid that contains etching ions to the major surface of the substrate to etch the to-be-removed layer;
   concentrating the etching liquid on the major surface of the substrate;
   hydrophilizing the concave-portion forming surface exposed by concentrating the etching liquid;
   diffusing the etching ions into a rinsing liquid by supplying the rinsing liquid to the major surface of the substrate after hydrophilizing the concave-portion forming surface; and
   removing the rinsing liquid from the major surface of the substrate.

2. The substrate processing method according to claim 1, wherein a width of the concave portion is 5 nm or less.

3. The substrate processing method according to claim 1, wherein the to-be-removed layer is a metal layer.

4. The substrate processing method according to claim 1, wherein diffusing the etching ions into the rinsing liquid includes diffusing the etching ions into the rinsing liquid by use of an ionic concentration gradient generated by bringing the rinsing liquid and the etching liquid into contact with each other in the concave portion.

5. The substrate processing method according to claim 1, wherein, after removing the rinsing liquid from the major surface of the substrate, diffusing the etching ions into the rinsing liquid and removing the rinsing liquid from the major surface of the substrate are each performed repeatedly at least once.

6. The substrate processing method according to claim 1, wherein the hydrophilizing includes oxidizing the concave-portion forming surface.

7. The substrate processing method according to claim 6, wherein the oxidation includes supplying a liquid oxidant to the major surface of the substrate.

8. The substrate processing method according to claim 7, further comprising removing the liquid oxidant supplied to the major surface of the substrate from the major surface of the substrate before diffusing the etching ions into the rinsing liquid.

9. The substrate processing method according to claim 6, wherein the oxidation includes performing at least either one of supply of a gaseous oxidant to the major surface of the substrate and irradiation of light to the major surface of the substrate.

10. The substrate processing method according to claim 1, wherein the concentrating includes drying the major surface of the substrate.

11. The substrate processing method according to claim 10, wherein the etching includes discharging the etching liquid from an etching liquid nozzle to the major surface of the substrate held by a substrate holder and supplying the etching liquid to the major surface of the substrate, and
   wherein the drying includes rotating the substrate by rotating the substrate holder around a rotational axis that passes through a central portion of the major surface of the substrate and that perpendicularly intersects the major surface of the substrate to evaporate a solvent component contained in the etching liquid from the major surface of the substrate.

12. The substrate processing method according to claim 10, wherein the drying includes evaporating a solvent component contained in the etching liquid from the major surface of the substrate by decompressing a space contiguous to the major surface of the substrate.

13. A substrate processing apparatus that processes a substrate, the substrate having a major surface including a concave-portion forming surface that forms a concave portion, the substrate having a to-be-removed layer formed in the concave portion, the substrate processing apparatus comprising:
   an etching-liquid nozzle that supplies an etching liquid containing etching ions and etching the to-be-removed layer to the major surface of the substrate;
   an etching-liquid concentrator that concentrates the etching liquid on the major surface of the substrate;
   a hydrophilizer that hydrophilizes the concave-portion forming surface exposed by concentrating the etching liquid;
   a rinsing-liquid nozzle that supplies a rinsing liquid that diffuses the etching ions into the rinsing liquid to the major surface of the substrate;
   a rinsing-liquid remover that removes the rinsing liquid from the major surface of the substrate; and
   a controller configured to execute the substrate processing method according to claim 1.

* * * * *